(12) United States Patent
Isowaki et al.

(10) Patent No.: US 9,214,171 B2
(45) Date of Patent: Dec. 15, 2015

(54) MAGNETORESISTANCE EFFECT ELEMENT, MAGNETIC HEAD, MAGNETIC HEAD ASSEMBLY, MAGNETIC RECORDING AND REPRODUCING DEVICE, AND METHOD FOR MANUFACTURING MAGNETORESISTANCE EFFECT ELEMENT

(71) Applicant: KABUSHIKI KAISHA TOSHIBA, Tokyo (JP)

(72) Inventors: Yousuke Isowaki, Kanagawa-ken (JP); Satoshi Shirotori, Kanagawa-ken (JP); Masayuki Takagishi, Tokyo (JP); Hitoshi Iwasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/171,959

(22) Filed: Feb. 4, 2014

(65) Prior Publication Data

US 2015/0221327 A1    Aug. 6, 2015

(30) Foreign Application Priority Data

Apr. 1, 2013 (JP) ................................. 2013-076336

(51) Int. Cl.
*G11B 5/39* (2006.01)

(52) U.S. Cl.
CPC ...... *G11B 5/3912* (2013.01); *G11B 2005/3996* (2013.01)

(58) Field of Classification Search
CPC .... G11B 5/3912; G11B 5/3932; G11B 5/398; G11B 2005/3996; G11B 5/11; G11B 5/3906; G11B 5/3116; G11B 5/39; G11B 5/3903
USPC ......................................... 360/319, 324–324.2
See application file for complete search history.

(56) References Cited

U.S. PATENT DOCUMENTS

| 8,089,734 B2 | 1/2012 | Miyauchi et al. |
| 8,576,518 B1 * | 11/2013 | Zeltser et al. ................. 360/319 |
| 2003/0231436 A1 | 12/2003 | Nishiyama |

(Continued)

FOREIGN PATENT DOCUMENTS

| JP | 2004-022614 | 1/2004 |
| JP | 2009-032382 | 2/2009 |

OTHER PUBLICATIONS

Office Action mailed Jul. 4, 2014 in counterpart Japanese Patent Application No. 2013-076336 and English-language translation thereof.

*Primary Examiner* — Will J Klimowicz
(74) *Attorney, Agent, or Firm* — Nixon & Vanderhye, P.C.

(57) ABSTRACT

According to one embodiment, a magnetoresistance effect element includes first and second shields, first and second side magnetic units, a stacked body, and a hard bias unit. The first side magnetic unit includes a first soft magnetic layer, a first nonmagnetic intermediate layer, and a second soft magnetic layer. The second side magnetic unit includes a third soft magnetic layer, a second nonmagnetic intermediate layer, and a fourth soft magnetic layer. The stacked body includes a fifth ferromagnetic layer, a third nonmagnetic intermediate layer, and a sixth ferromagnetic layer. The hard bias unit is provided between the first and second shields. A first distance between the first and fifth magnetic layers is shorter than a second distance between the second and sixth magnetic layers. A third distance between the third and fifth magnetic layers is shorter than a fourth distance between the fourth and sixth magnetic layers.

14 Claims, 9 Drawing Sheets

(56) References Cited

U.S. PATENT DOCUMENTS

| | | |
|---|---|---|
| 2009/0034132 A1 | 2/2009 | Miyauchi et al. |
| 2014/0002930 A1* | 1/2014 | Dimitrov et al. ........... 360/235.4 |
| 2014/0004385 A1* | 1/2014 | Colak et al. ................... 428/815 |
| 2014/0004386 A1* | 1/2014 | Covington et al. ........... 428/816 |
| 2014/0049857 A1* | 2/2014 | Isowaki et al. ................ 360/244 |
| 2014/0146418 A1* | 5/2014 | Sapozhnikov et al. .. 360/125.12 |
| 2014/0153138 A1* | 6/2014 | Le et al. ........................ 360/294 |
| 2014/0233135 A1* | 8/2014 | Hashimoto et al. ........... 360/244 |
| 2015/0062757 A1* | 3/2015 | Dimitrov et al. ............ 360/235.4 |
| 2015/0147481 A1* | 5/2015 | Braganca et al. ............. 427/529 |
| 2015/0154990 A1* | 6/2015 | Jiang et al. .................... 360/319 |
| 2015/0154991 A1* | 6/2015 | Le et al. ........................ 360/319 |

* cited by examiner

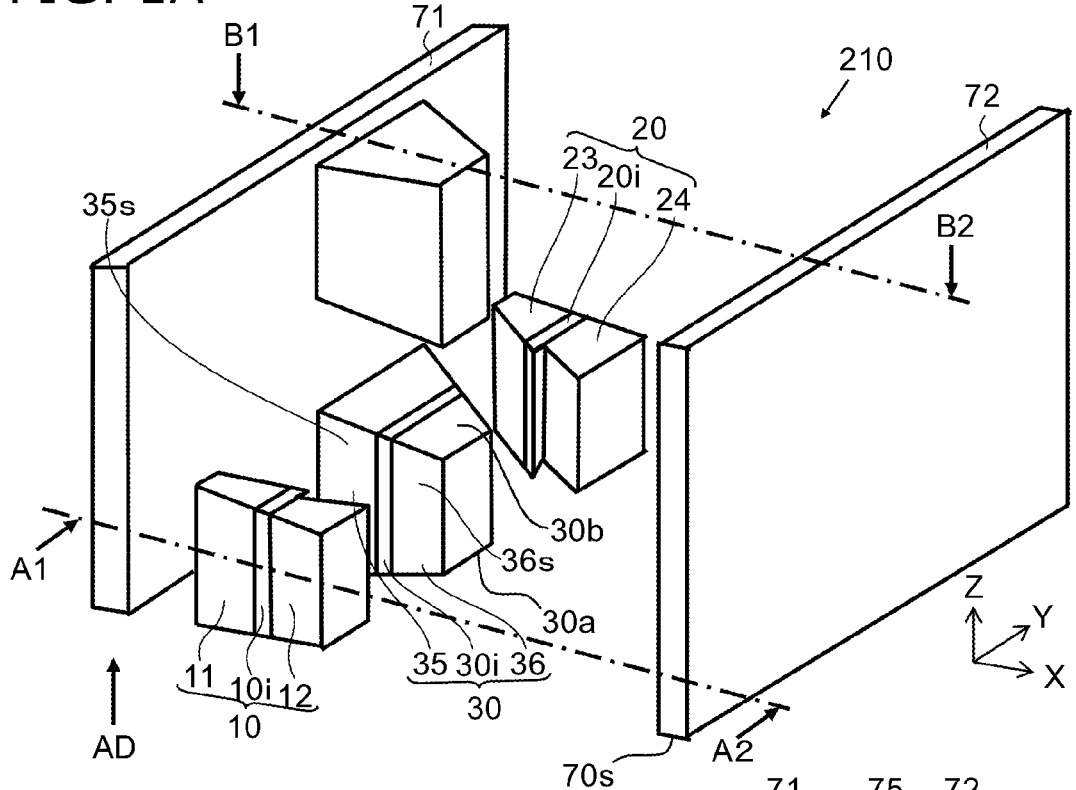
FIG. 1A
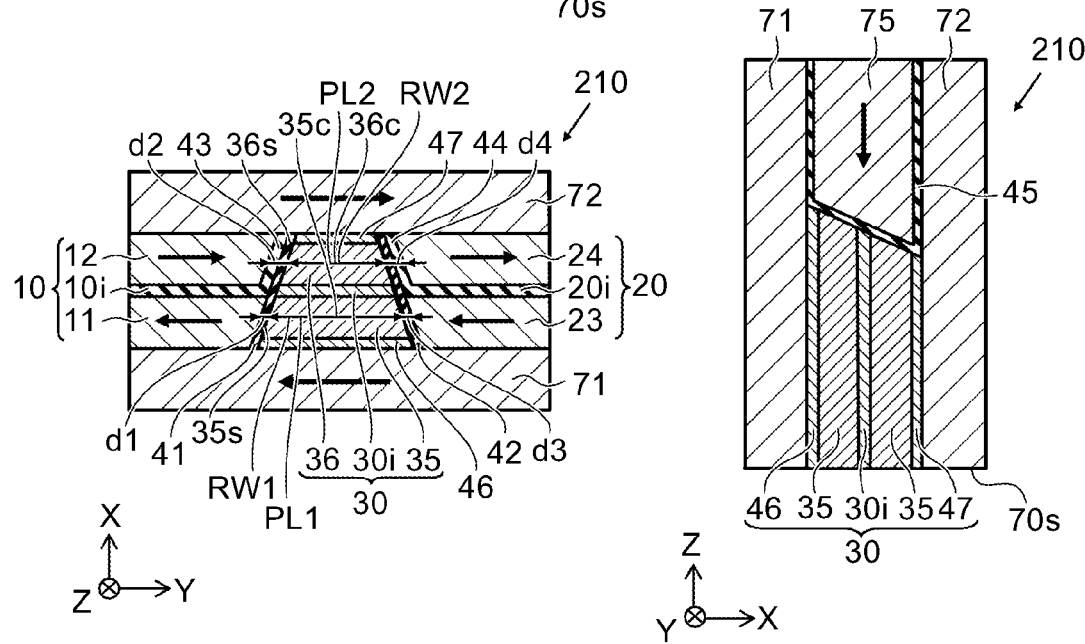
FIG. 1B
FIG. 1C

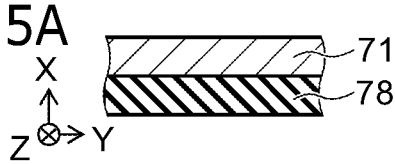
FIG. 5A
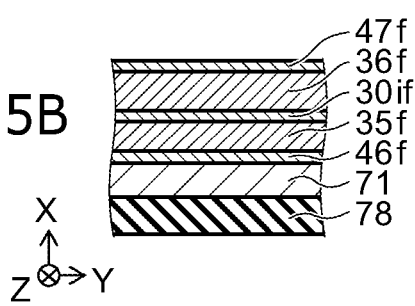
FIG. 5B
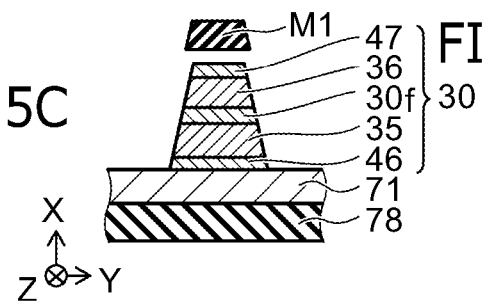
FIG. 5C
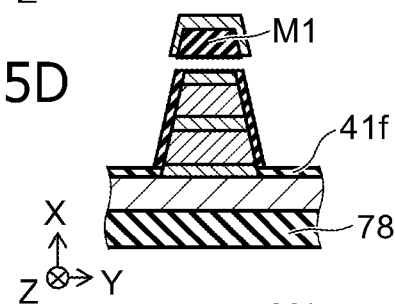
FIG. 5D
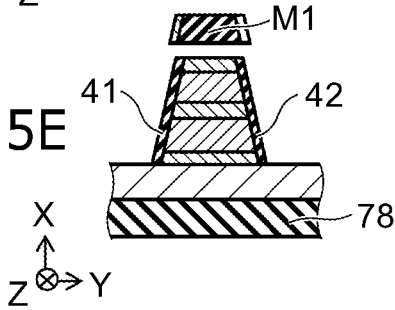
FIG. 5E
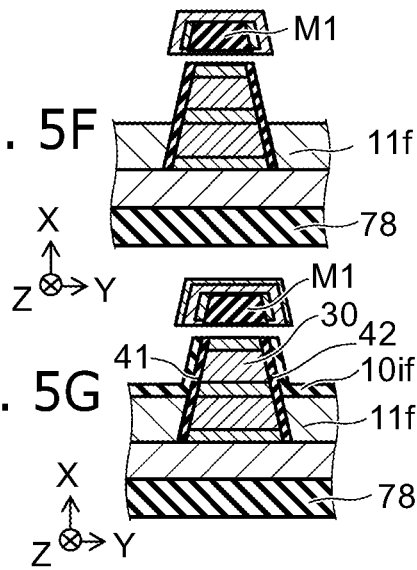
FIG. 5F
FIG. 5G
FIG. 5H
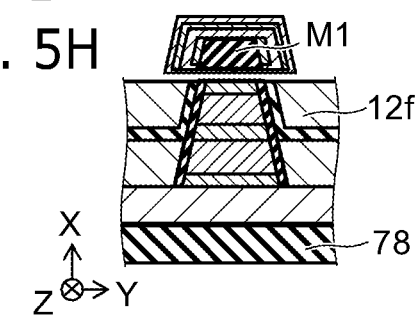
FIG. 5I
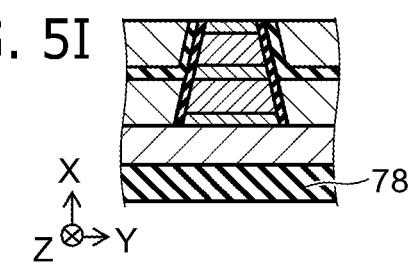
FIG. 5J
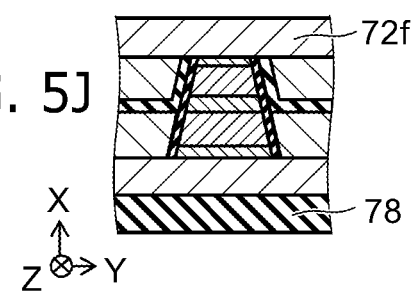

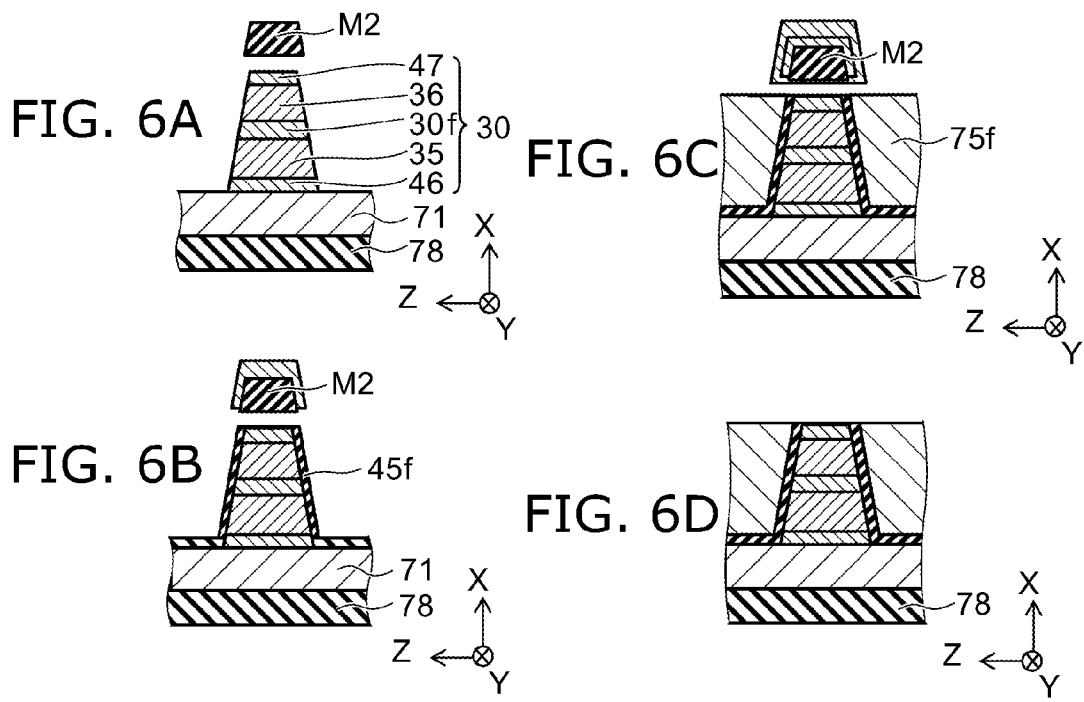
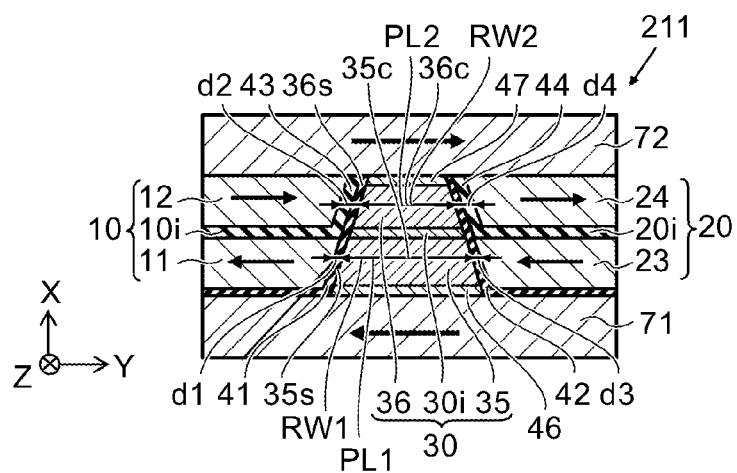
FIG. 7

MAGNETORESISTANCE EFFECT ELEMENT, MAGNETIC HEAD, MAGNETIC HEAD ASSEMBLY, MAGNETIC RECORDING AND REPRODUCING DEVICE, AND METHOD FOR MANUFACTURING MAGNETORESISTANCE EFFECT ELEMENT

CROSS-REFERENCE TO RELATED APPLICATIONS

This application is based upon and claims the benefit of priority from Japanese Patent Application No. 2013-076336, filed on Apr. 1, 2013; the entire contents of which are incorporated herein by reference.

FIELD

Embodiments described herein relate generally to a magnetoresistance effect element, a magnetic head, a magnetic head assembly, a magnetic recording and reproducing device, and a method for manufacturing the magnetoresistance effect element.

BACKGROUND

A magnetoresistance effect element is used as a reproducing element of a HDD (hard disk drive), etc. To increase the recording density, it is desirable to suppress the noise while increasing the reproduction resolution of the magnetoresistance effect element.

BRIEF DESCRIPTION OF THE DRAWINGS

FIG. 1A to FIG. 1C are schematic views illustrating a magnetoresistance effect element according to a first embodiment;

FIG. 5A to FIG. 5J are schematic cross-sectional views illustrating the method for manufacturing the magnetoresistance effect element according to the first embodiment;

FIG. 6A to FIG. 6D are schematic cross-sectional views illustrating the method for manufacturing the magnetoresistance effect element according to the first embodiment;

FIG. 7 is a schematic view illustrating another magnetoresistance effect element according to the first embodiment;

DETAILED DESCRIPTION

Figure 2:
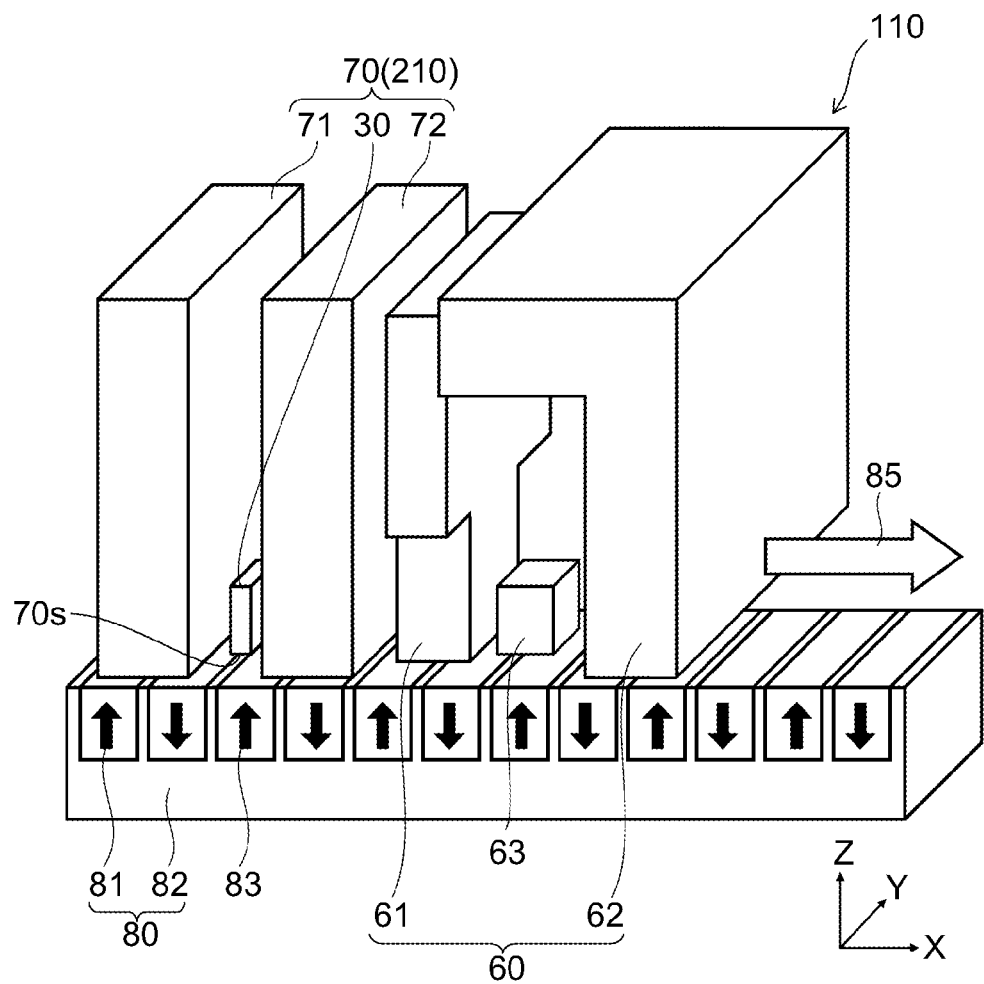
FIG. 2 is a schematic perspective view illustrating the magnetic head to which the magnetoresistance effect element according to the first embodiment is mounted.

According to one embodiment, a magnetoresistance effect element includes a first shield, a second shield, a first side magnetic unit, a second side magnetic unit, a stacked body, and a hard bias unit. The first side magnetic unit includes a first magnetic layer provided between the first shield and the second shield, the first magnetic layer being soft magnetic, a first intermediate layer provided between the first magnetic layer and the second shield, the first intermediate layer being nonmagnetic, and a second magnetic layer provided between the first intermediate layer and the second shield, the second magnetic layer being soft magnetic. The second side magnetic unit includes a third magnetic layer provided between the first shield and the second shield to be separated from the first side magnetic unit in a second direction intersecting a first direction from the first shield toward the second shield, the third magnetic layer being soft magnetic, a second intermediate layer provided between the third magnetic layer and the second shield to be separated from the first side magnetic unit in the second direction, the second intermediate layer being nonmagnetic, and a fourth magnetic layer provided between the second intermediate layer and the second shield to be separated from the first side magnetic unit in the second direction, the fourth magnetic layer being soft magnetic. The stacked body includes a fifth magnetic layer provided between the first shield and the second shield and between the first side magnetic unit and the second side magnetic unit, the fifth magnetic layer being ferromagnetic and having a first surface area, a third intermediate layer provided between the fifth magnetic layer and the second shield, the third intermediate layer being nonmagnetic, and a sixth magnetic layer provided between the third intermediate layer and the second shield, the sixth magnetic layer being ferromagnetic and having a second surface area less than the first surface area. The hard bias unit is provided between the first shield and the second shield to be arranged with the stacked body in a third direction intersecting the first direction and intersecting the second direction. A first distance between the first magnetic layer and the fifth magnetic layer in a first plane perpendicular to the first direction and passing through a center of the fifth magnetic layer in the first direction is shorter than a second distance between the second magnetic layer and the sixth magnetic layer in a second plane perpendicular to the first direction and passing through a center of the sixth magnetic layer in the first direction. A third distance between the third magnetic layer and the fifth magnetic layer in the first plane is shorter than a fourth distance between the fourth magnetic layer and the sixth magnetic layer in the second plane.

According to one embodiment, a magnetoresistance effect element includes a first shield, a second shield, a first side magnetic unit, a second side magnetic unit, a stacked body, and a hard bias unit. The first side magnetic unit includes a first magnetic layer provided between the first shield and the second shield, the first magnetic layer being soft magnetic, a first intermediate layer provided between the first magnetic layer and the second shield, the first intermediate layer being nonmagnetic, and a second magnetic layer provided between the first intermediate layer and the second shield, the second magnetic layer being soft magnetic. The second side magnetic unit includes a third magnetic layer provided between the first shield and the second shield to be separated from the first side magnetic unit in a second direction intersecting a first direction from the first shield toward the second shield, the third magnetic layer being soft magnetic, a second intermediate layer provided between the third magnetic layer and the second shield to be separated from the first side magnetic unit in the second direction, the second intermediate layer being nonmagnetic, and a fourth magnetic layer provided between the second intermediate layer and the second shield to be separated from the first side magnetic unit in the second direction, the fourth magnetic layer being soft magnetic. The stacked body includes a fifth magnetic layer provided between the first shield and the second shield and between the first side magnetic unit and the second side magnetic unit, the fifth magnetic layer being ferromagnetic and having a first surface area, a third intermediate layer provided between the fifth magnetic layer and the second shield, the third intermediate layer being nonmagnetic, and a sixth magnetic layer provided between the third intermediate layer and the second shield, the sixth magnetic layer being ferromagnetic and having a second surface area less than the first surface area. The hard bias unit is provided between the first shield and the second shield to be arranged with the stacked body in a third direction intersecting the first direction and intersecting the second direction. A saturation magnetic flux density of the fifth magnetic layer is less than a saturation magnetic flux density of the sixth magnetic layer.

According to one embodiment, a magnetoresistance effect element includes a first shield, a second shield, a first side magnetic unit, a second side magnetic unit, a stacked body, and a hard bias unit. The first side magnetic unit includes a first magnetic layer provided between the first shield and the second shield, the first magnetic layer being soft magnetic, a first intermediate layer provided between the first magnetic layer and the second shield, the first intermediate layer being nonmagnetic, and a second magnetic layer provided between the first intermediate layer and the second shield, the second magnetic layer being soft magnetic. The second side magnetic unit includes a third magnetic layer provided between the first shield and the second shield to be separated from the first side magnetic unit in a second direction intersecting a first direction from the first shield toward the second shield, the third magnetic layer being soft magnetic, a second intermediate layer provided between the third magnetic layer and the second shield to be separated from the first side magnetic unit in the second direction, the second intermediate layer being nonmagnetic, and a fourth magnetic layer provided between the second intermediate layer and the second shield to be separated from the first side magnetic unit in the second direction, the fourth magnetic layer being soft magnetic. The stacked body includes a fifth magnetic layer provided between the first shield and the second shield and between the first side magnetic unit and the second side magnetic unit, the fifth magnetic layer being ferromagnetic and having a first surface area, a third intermediate layer provided between the fifth magnetic layer and the second shield, the third intermediate layer being nonmagnetic, and a sixth magnetic layer provided between the third intermediate layer and the second shield, the sixth magnetic layer being ferromagnetic and having a second surface area less than the first surface area. The hard bias unit is provided between the first shield and the second shield to be arranged with the stacked body in a third direction intersecting the first direction and intersecting the second direction. A saturation magnetic flux density of the first magnetic layer is less than a saturation magnetic flux density of the second magnetic layer.

According to one embodiment, a magnetic head includes a magnetoresistance effect element. The element includes a first shield, a second shield, a first side magnetic unit, a second side magnetic unit, a stacked body, and a hard bias unit. The first side magnetic unit includes a first magnetic layer provided between the first shield and the second shield, the first magnetic layer being soft magnetic, a first intermediate layer provided between the first magnetic layer and the second shield, the first intermediate layer being nonmagnetic, and a second magnetic layer provided between the first intermediate layer and the second shield, the second magnetic layer being soft magnetic. The second side magnetic unit includes a third magnetic layer provided between the first shield and the second shield to be separated from the first side magnetic unit in a second direction intersecting a first direction from the first shield toward the second shield, the third magnetic layer being soft magnetic, a second intermediate layer provided between the third magnetic layer and the second shield to be separated from the first side magnetic unit in the second direction, the second intermediate layer being nonmagnetic, and a fourth magnetic layer provided between the second intermediate layer and the second shield to be separated from the first side magnetic unit in the second direction, the fourth magnetic layer being soft magnetic. The stacked body includes a fifth magnetic layer provided between the first shield and the second shield and between the first side magnetic unit and the second side magnetic unit, the fifth magnetic layer being ferromagnetic and having a first surface area, a third intermediate layer provided between the fifth magnetic layer and the second shield, the third intermediate layer being nonmagnetic, and a sixth magnetic layer provided between the third intermediate layer and the second shield, the sixth magnetic layer being ferromagnetic and having a second surface area less than the first surface area. The hard bias unit is provided between the first shield and the second shield to be arranged with the stacked body in a third direction intersecting the first direction and intersecting the second direction. A first distance between the first magnetic layer and the fifth magnetic layer in a first plane perpendicular to the first direction and passing through a center of the fifth magnetic layer in the first direction is shorter than a second distance between the second magnetic layer and the sixth magnetic layer in a second plane perpendicular to the first direction and passing through a center of the sixth magnetic layer in the first direction. A third distance between the third magnetic layer and the fifth magnetic layer in the first plane is shorter than a fourth distance between the fourth magnetic layer and the sixth magnetic layer in the second plane.

According to one embodiment, a magnetic head includes a magnetoresistance effect element. The element includes a first shield, a second shield, a first side magnetic unit, a second side magnetic unit, a stacked body, and a hard bias unit. The first side magnetic unit includes a first magnetic layer provided between the first shield and the second shield, the first magnetic layer being soft magnetic, a first intermediate layer provided between the first magnetic layer and the second shield, the first intermediate layer being nonmagnetic, and a second magnetic layer provided between the first intermediate layer and the second shield, the second magnetic layer being soft magnetic. The second side magnetic unit includes a third magnetic layer provided between the first shield and the second shield to be separated from the first side magnetic unit in a second direction intersecting a first direction from the first shield toward the second shield, the third magnetic layer being soft magnetic, a second intermediate layer provided between the third magnetic layer and the second shield to be separated from the first side magnetic unit in the second direction, the second intermediate layer being nonmagnetic, and a fourth magnetic layer provided between the second intermediate layer and the second shield to be separated from the first side magnetic unit in the second direction, the fourth magnetic layer being soft magnetic. The stacked body includes a fifth magnetic layer provided between the first shield and the second shield and between the first side magnetic unit and the second side magnetic unit, the fifth magnetic layer being ferromagnetic and having a first surface area, a third intermediate layer provided between the fifth magnetic layer and the second shield, the third intermediate layer being nonmagnetic, and a sixth magnetic layer provided between the third intermediate layer and the second shield, the sixth magnetic layer being ferromagnetic and having a second surface area less than the first surface area. The hard bias unit is provided between the first shield and the second shield to be arranged with the stacked body in a third direction intersecting the first direction and intersecting the second direction. A saturation magnetic flux density of the fifth magnetic layer is less than a saturation magnetic flux density of the sixth magnetic layer.

According to one embodiment, a magnetic head includes a magnetoresistance effect element. The element includes a first shield, a second shield, a first side magnetic unit, a second side magnetic unit, a stacked body, and a hard bias unit. The first side magnetic unit includes a first magnetic layer provided between the first shield and the second shield, the first magnetic layer being soft magnetic, a first intermediate layer provided between the first magnetic layer and the second shield, the first intermediate layer being nonmagnetic, and a second magnetic layer provided between the first intermediate layer and the second shield, the second magnetic layer being soft magnetic. The second side magnetic unit includes a third magnetic layer provided between the first shield and the second shield to be separated from the first side magnetic unit in a second direction intersecting a first direction from the first shield toward the second shield, the third magnetic layer being soft magnetic, a second intermediate layer provided between the third magnetic layer and the second shield to be separated from the first side magnetic unit in the second direction, the second intermediate layer being nonmagnetic, and a fourth magnetic layer provided between the second intermediate layer and the second shield to be separated from the first side magnetic unit in the second direction, the fourth magnetic layer being soft magnetic. The stacked body includes a fifth magnetic layer provided between the first shield and the second shield and between the first side magnetic unit and the second side magnetic unit, the fifth magnetic layer being ferromagnetic and having a first surface area, a third intermediate layer provided between the fifth magnetic layer and the second shield, the third intermediate layer being nonmagnetic, and a sixth magnetic layer provided between the third intermediate layer and the second shield, the sixth magnetic layer being ferromagnetic and having a second surface area less than the first surface area. The hard bias unit is provided between the first shield and the second shield to be arranged with the stacked body in a third direction intersecting the first direction and intersecting the second direction. A saturation magnetic flux density of the first magnetic layer is less than a saturation magnetic flux density of the second magnetic layer. According to one embodiment, a magnetic head assembly includes one of the magnetic heads as described above, a suspension configured to have the magnetic head mounted to one end of the suspension, and an actuator arm connected to one other end of the suspension.

According to one embodiment, a method is disclosed for manufacturing a magnetoresistance effect element. The method can include forming a first ferromagnetic film on a first shield, forming a first nonmagnetic intermediate film on the first ferromagnetic film, and forming a second ferromagnetic film on the first nonmagnetic intermediate film. The method can include forming a stacked body including a first ferromagnetic layer, a nonmagnetic intermediate layer, and a second ferromagnetic layer by patterning the first ferromagnetic film, the first nonmagnetic intermediate film, and the second ferromagnetic film, the first ferromagnetic layer being formed from the first ferromagnetic film to have a first surface area, the nonmagnetic intermediate layer being formed from the first nonmagnetic intermediate film, the second ferromagnetic layer being formed from the second ferromagnetic film to have a second surface area less than the first surface area. The method can include forming a first nonmagnetic film on a side wall of the stacked body to have a first portion contacting the first ferromagnetic layer and a second portion contacting the second ferromagnetic layer, and forming a first soft magnetic film on the first shield to contact the first portion and oppose the first ferromagnetic layer with the first portion interposed. The method can include forming a second nonmagnetic intermediate film on the first soft magnetic film to cover the second portion, and forming a second soft magnetic film on the second nonmagnetic intermediate film. The method can include forming a second shield on the stacked body and on the second soft magnetic film. The method can include forming a hard bias unit between the first shield and the second shield to be arranged with the stacked body in a third direction intersecting the first direction and intersecting the second direction.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1A to FIG. 1C are schematic views illustrating a magnetoresistance effect element according to a first embodiment.

FIG. 1A is a schematic perspective view. For easier viewing of the drawing in FIG. 1A, the insulating portions are not shown; and some of the components are shown as being separated from each other. FIG. 1B is a cross-sectional view along line A1-A2 of FIG. 1A. FIG. 1C is a cross-sectional view along line B1-B2 of FIG. 1A.

As shown in FIG. 1A to FIG. 1C, the magnetoresistance effect element 210 according to the embodiment includes a first shield 71, a second shield 72, a first side magnetic unit 10, a second side magnetic unit 20, a stacked body 30, and a hard bias unit 75.

The first side magnetic unit 10 is provided between the first shield 71 and the second shield 72. The first side magnetic unit 10 includes a first magnetic layer 11, a first intermediate layer 10i, and a second magnetic layer 12. The first magnetic layer 11 is provided between the first shield 71 and the second shield 72 and is soft magnetic. The first intermediate layer 10i is provided between the first magnetic layer 11 and the second shield 72. The second magnetic layer 12 is provided between the first intermediate layer 10i and the second shield 72 and is soft magnetic.

A stacking direction (a first direction) from the first shield 71 toward the second shield 72 is taken as an X-axis direction. One direction perpendicular to the X-axis direction is taken as a Y-axis direction. A direction perpendicular to the X-axis direction and perpendicular to the Y-axis direction is taken as a Z-axis direction.

The second side magnetic unit 20 is provided between the first shield 71 and the second shield 72. The second side magnetic unit 20 is separated from the first side magnetic unit 10 in a second direction intersecting the stacking direction (the first direction). The second direction is, for example, the Y-axis direction. The second side magnetic unit 20 includes a third magnetic layer 23, a second intermediate layer 20i, and a fourth magnetic layer 24. The third magnetic layer 23 is provided between the first shield 71 and the second shield 72, is separated from the first side magnetic unit 10 in the second direction intersecting the stacking direction (the first direction), and is soft magnetic. The second intermediate layer 20i is provided between the third magnetic layer 23 and the second shield 72, is separated from the first side magnetic unit 10 in the second direction recited above, and is nonmagnetic. The fourth magnetic layer 24 is provided between the second intermediate layer 20i and the second shield 72, is separated from the first side magnetic unit 10 in the second direction recited above, and is soft magnetic.

The stacked body 30 is provided between the first shield 71 and the second shield 72 and between the first side magnetic unit 10 and the second side magnetic unit 20. The stacked body 30 includes a fifth magnetic layer 35, a third intermediate layer 30i, and a sixth magnetic layer 36. The fifth magnetic layer 35 is provided between the first shield 71 and the second shield 72 and between the first side magnetic unit 10 and the second side magnetic unit 20. The fifth magnetic layer 35 has a first surface area S1 when projected onto a projection plane (the X-Y plane) perpendicular to the stacking direction (the first direction). The fifth magnetic layer 35 is ferromagnetic. The third intermediate layer 30i is provided between the fifth magnetic layer 35 and the second shield 72 and is nonmagnetic. The sixth magnetic layer 36 is provided between the third intermediate layer 30i and the second shield 72 and has a second surface area S2 when projected onto the plane (the X-Y plane) recited above. The second surface area S2 is less than the first surface area S1. The sixth magnetic layer 36 is ferromagnetic.

In the example, the side surface of the stacked body 30 has a tapered configuration. The fifth magnetic layer 35 has a side surface 35s intersecting the stacking direction. The side surface 35s of the fifth magnetic layer 35 is tilted with respect to the stacking direction (the first direction). The sixth magnetic layer 36 has a side surface 36s intersecting the stacking direction. The side surface 36s of the sixth magnetic layer 36 also is tilted with respect to the stacking direction (the first direction). In the example, the side surface 36s of the sixth magnetic layer 36 has a tapered configuration that is continuous with the side surface 35s of the fifth magnetic layer 35. For example, the side surface 36s of the sixth magnetic layer 36 is in a plane including the side surface 35s of the fifth magnetic layer 35. For example, because the side surface of the stacked body 30 has such a tapered configuration, the first surface area S1 is greater than the second surface area S2.

The hard bias unit 75 is provided between the first shield 71 and the second shield 72 to be arranged with the stacked body 30 in a third direction. The third direction intersects the stacking direction (the first direction) and intersects the second direction. The third direction is, for example, the Z-axis direction.

For example, in the case where the magnetoresistance effect element 210 is applied to a magnetic head, a medium-opposing surface 70s is set in the magnetoresistance effect element 210. The lower surface (a first surface 30a) of the stacked body 30 is the surface on the medium-opposing surface 70s side. A not-shown protective film, etc., may be provided at the medium-opposing surface 70s.

The hard bias unit 75 opposes the upper surface (a second surface 30b) of the stacked body 30. The upper surface (the second surface 30b) is the surface on the side opposite to the lower surface (the first surface 30a).

In the specification of the application, the state of being "opposed" includes the state of directly facing each other and the state of facing each other with another component inserted therebetween.

In the magnetoresistance effect element 210, for example, the first shield 71 and the fifth magnetic layer 35 do not have exchange coupling (magnetic exchange coupling) with each other. The second shield 72 and the sixth magnetic layer 36 do not have exchange coupling with each other. On the other hand, the first magnetic layer 11 has exchange coupling with the first shield 71; and the third magnetic layer 23 has exchange coupling with the first shield 71. The second magnetic layer 12 has exchange coupling with the second shield 72; and the fourth magnetic layer 24 has exchange coupling with the second shield 72. For example, the exchange coupling between the first shield 71 and the first magnetic layer 11 and the exchange coupling between the first shield 71 and the third magnetic layer 23 are stronger than the exchange coupling between the first shield 71 and the fifth magnetic layer 35. The exchange coupling between the second shield 72 and the second magnetic layer 12 and the exchange coupling between the second shield 72 and the fourth magnetic layer 24 are stronger than the exchange coupling between the second shield 72 and the sixth magnetic layer 36.

For convenience in the specification of the application, the state of not having exchange coupling is taken to be the state of having exchange coupling that is weaker than that of the state of having exchange coupling.

The direction of the magnetization of the fifth magnetic layer 35 is changeable; and the direction of the magnetization of the sixth magnetic layer 36 also is changeable. The fifth magnetic layer 35 is, for example, a free magnetic layer; and the sixth magnetic layer 36 also is a free magnetic layer.

In the example, a nonmagnetic layer (a sixth nonmagnetic layer 46) is further provided between the fifth magnetic layer 35 and the first shield 71; and a nonmagnetic layer (a seventh nonmagnetic layer 47) is further provided between the sixth magnetic layer 36 and the second shield 72. For example, the strength of the exchange coupling can be adjusted by these nonmagnetic layers. The nonmagnetic layers are, for example, conductive. The magnetic layers are taken to be included in the stacked body 30.

In the example, first to fifth nonmagnetic layers 41 to 45 are further provided. The first to fifth nonmagnetic layers 41 to 45 are, for example, insulative.

The first nonmagnetic layer 41 is provided between the first magnetic layer 11 and the fifth magnetic layer 35 and between the second magnetic layer 12 and the sixth magnetic layer 36. The second nonmagnetic layer 42 is provided between the third magnetic layer 23 and the fifth magnetic layer 35 and between the fourth magnetic layer 24 and the sixth magnetic layer 36.

The third nonmagnetic layer 43 is provided between the second magnetic layer 12 and the sixth magnetic layer 36. In the example, the third nonmagnetic layer 43 is disposed between the first nonmagnetic layer 41 and the second magnetic layer 12. In the example, the third nonmagnetic layer 43 is continuous with the first intermediate layer 10i.

The fourth nonmagnetic layer 44 is provided between the fourth magnetic layer 24 and the sixth magnetic layer 36. In the example, the fourth nonmagnetic layer 44 is disposed between the second nonmagnetic layer 42 and the fourth magnetic layer 24. In the example, the fourth nonmagnetic layer 44 is continuous with the second intermediate layer 20i.

As shown in FIG. 1C, the fifth nonmagnetic layer 45 is provided between the stacked body 30 and the hard bias unit 75. In the example, the fifth nonmagnetic layer 45 extends between the first shield 71 and the hard bias unit 75 and between the second shield 72 and the hard bias unit 75.

In the example, as illustrated in FIG. 1B, the thickness of the insulating portion provided between the first magnetic layer 11 and the fifth magnetic layer 35 is thinner than the thickness of the insulating portion provided between the second magnetic layer 12 and the sixth magnetic layer 36.

For example, the fifth magnetic layer 35 has a center (a first center 35c) in the stacking direction (the first direction, i.e., the X-axis direction). The sixth magnetic layer 36 has a center (a second center 36c) in the stacking direction (the first direction, i.e., the X-axis direction).

The distance between the first magnetic layer 11 and the fifth magnetic layer 35 in a first plane PL1 perpendicular to the stacking direction (the first direction) and passing through the first center 35c of the fifth magnetic layer 35 is referred to as a first distance d1. The distance between the second magnetic layer 12 and the sixth magnetic layer 36 in a second plane PL2 perpendicular to the stacking direction (the first direction) and passing through the second center 36c of the sixth magnetic layer 36 is referred to as a second distance d2. The first distance d1 is shorter than the second distance d2.

The distance between the third magnetic layer 23 and the fifth magnetic layer 35 in the first plane PL1 recited above is referred to as a third distance d3. The distance between the fourth magnetic layer 24 and the sixth magnetic layer 36 in the second plane PL2 recited above is referred to as a fourth distance d4. The third distance d3 is shorter than the fourth distance d4.

The information relating to these distances is obtained by, for example, electron microscopy (e.g., cross section TEM), etc.

FIG. 2 is a schematic perspective view illustrating the magnetic head to which the magnetoresistance effect element according to the first embodiment is mounted.

As shown in FIG. 2, the magnetic head 110 includes a reproducing unit 70 (a reproducing head unit). In the example, the magnetic head 110 further includes a write unit 60 (a write head unit). The magnetoresistance effect element 210 according to the embodiment is used as the reproducing unit 70.

In FIG. 2, some of the components included in the reproducing unit 70 (the magnetoresistance effect element 210) are not shown.

The write unit 60 includes, for example, a major electrode 61 and a write unit return path 62. In the magnetic head 110, the write unit 60 may further include a portion that assists the writing operation such as, for example, a spin torque oscillator (STO) 63, etc. The write unit 60 may have any configuration in the magnetic head 110.

For example, the stacked body 30, the first shield 71, and the second shield 72 are provided in the reproducing unit 70.

The components of the reproducing unit 70 and the components of the write unit 60 are separated from each other by a not-shown insulator such as, for example, alumina, etc.

Figure 3:
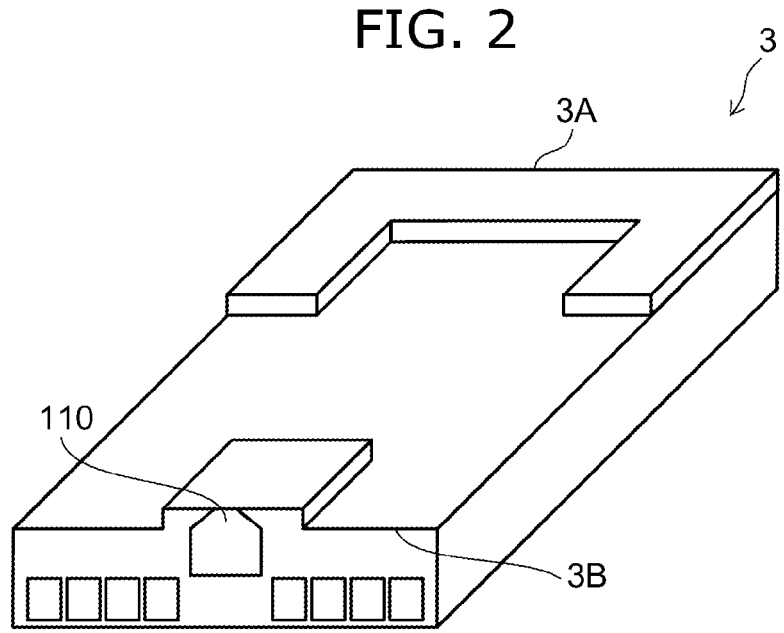
FIG. 3 is a schematic perspective view illustrating a head slider to which the magnetoresistance effect element according to the first embodiment is mounted.

FIG. 3 is a schematic perspective view illustrating a head slider to which the magnetoresistance effect element according to the first embodiment is mounted.

As shown in FIG. 3, the magnetic head 110 is mounted to a head slider 3. The head slider 3 includes, for example, $Al_2O_3$/TiC, etc. The head slider 3 moves relative to a magnetic recording medium 80 while flying over or contacting the magnetic recording medium 80 such as a magnetic disk, etc.

The head slider 3 has, for example, an air inflow side 3A and an air outflow side 3B. The magnetic head 110 is disposed at the side surface of the air outflow side 3B of the head slider 3 or the like. Thereby, the magnetic head 110 that is mounted to the head slider 3 moves relative to the magnetic recording medium 80 while flying over or contacting the magnetic recording medium 80.

As shown in FIG. 2, the magnetic recording medium 80 includes, for example, a medium substrate 82, and a magnetic recording layer 81 provided on the medium substrate 82. A magnetization 83 of the magnetic recording layer 81 is controlled by the magnetic field applied by the write unit 60; and the writing operation is thereby implemented. The magnetic recording medium 80 moves relative to the magnetic head 110 along a medium movement direction 85.

The reproducing unit 70 is disposed to oppose the magnetic recording medium 80. The reproducing unit 70 has the medium-opposing surface 70s (the air bearing surface (ABS)) opposing the magnetic recording medium 80. The magnetic recording medium 80 moves relative to the magnetic head 110 along the medium movement direction 85. The reproducing unit 70 senses the direction of the magnetization 83 of the magnetic recording layer 81. Thereby, the reproduction operation is performed. The reproducing unit 70 senses the recorded signal recorded in the magnetic recording medium 80.

For example, the Z-axis direction is the height direction. The X-axis direction corresponds to, for example, the recording track movement direction (the track direction) of the magnetic recording medium 80. The Y-axis direction corresponds to, for example, the recording track width direction (the track width direction) of the magnetic recording medium 80. The track width direction specifies the bit width.

In the embodiment, as described above, the first distance d1 is set to be shorter than the second distance d2; and the third distance d3 is set to be shorter than the fourth distance d4. Thereby, a low-noise magnetoresistance effect element can be provided.

For example, a TMR head (Tunneling Magneto Resistive head) that conducts a current in the film surface perpendicular direction is used as a reproducing head that is used in a HDD, etc. A TMR element unit which is a reproducing element unit is interposed between the shields on and under the TMR element unit. The reproduction resolution in the bit direction is specified by, for example, the spacing of the shields on and under the TMR element unit. The reproduction resolution in the track width direction is specified by, for example, the element width in the track width direction of the reproducing element unit. The spacing of the shields on and under the TMR element unit is downscaled and the reproducing element is downscaled as the recording density is increased. For example, to realize a surface recording density of 2 terabits in a surface area of 1 square inch (2 Tb/$inch^2$), for example, the spacing of the shields on and under the TMR element unit is set to be about 20 nm (nanometers) or less; and the element width of the reproducing element unit is set to be about 20 nm or less.

An antiferromagnetic layer (e.g., an IrMn alloy), a pinned layer, an intermediate insulating layer, and a free magnetic layer are provided in the TMR head. A TMR element unit having good characteristics is difficult to disposition between the shields on and under the TMR element unit with the spacing of not more than 20 nm.

On the other hand, a method is being studied in which a reproduction resolution such as that recited above is obtained by a configuration in which the reproducing element unit does not include the antiferromagnetic layer. Such a configuration includes two free magnetic layers and an intermediate layer provided between the two free magnetic layers. In other words, the configuration is a trilayer configuration.

It was found by investigations of the inventor of the application that the noise of such a trilayer structure is large. The noise will now be described.

Figure 4A:
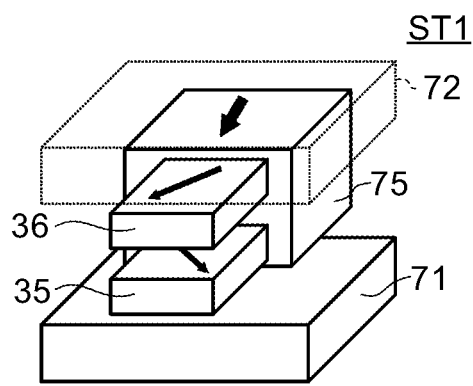
FIG. 4A and FIG. 4B are schematic perspective views illustrating characteristics of the magnetoresistance effect element according to the first embodiment.
Figure 4B:
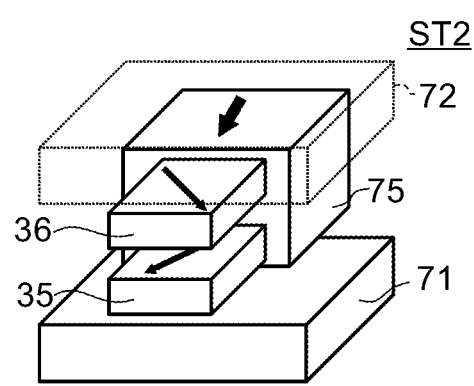

FIG. 4A and FIG. 4B are schematic perspective views illustrating characteristics of the magnetoresistance effect element according to the first embodiment.

These drawings illustrate states of the magnetoresistance effect element having different magnetizations.

In the magnetoresistance effect element, two free magnetic layers (corresponding to the fifth magnetic layer 35 and the sixth magnetic layer 36) are provided between the first shield 71 and the second shield 72. An intermediate layer (not-shown in these drawings, corresponding to the third intermediate layer 30$i$) is provided between the two free magnetic layers. In other words, a trilayer structure is provided. Further, the hard bias unit 75 is disposed adjacently to the free magnetic layers.

In the initial state of such a magnetoresistance effect element, the angle between the magnetizations of the two free magnetic layers is set to be, for example, 90 degrees. The setting of the magnetizations is performed by, for example, the function of the hard bias unit 75. The magnetizations move from such an initial state in a scissor-like fashion according to the strength and orientation of the signal magnetic field corresponding to the information to be reproduced. In other words, the angle between the directions of the magnetizations of the two free magnetic layers changes. Thereby, the resistance to the current flowing through the two free magnetic layers changes; and the information to be reproduced is sensed by sensing the change.

It was found that the magnetic noise in such a configuration is large. It is considered that the cause of the magnetic noise is as follows.

It was found that a first state ST1 illustrated in FIG. 4A and a second state ST2 illustrated in FIG. 4B exist in the initial state recited above. The potential energies in the two states are equal to each other. Thus, two types of states exist in which the angle between the magnetizations is 90 degrees. A transition between the two states occurs due to heat fluctuation. Therefore, in the reproducing head operation, it is difficult to set the state of the magnetization to be one designated type of magnetization.

It was found that low frequency noise occurs due to the transition between two such states in which the angle between the magnetizations is 90 degrees. Therefore, the magnetic S/N ratio (the heat fluctuation S/N ratio) of the trilayer configuration drastically decreases.

When the magnetic S/N ratio (the heat fluctuation S/N ratio) decreases, the noise of the reproduction signal becomes large when using the magnetoresistance effect element as the reproducing head. This phenomenon is characteristic to the trilayer configuration. Such a phenomenon will be referred to herein as "magnetization switching noise."

It was found that it is necessary to reduce the magnetization switching noise in the trilayer-type magnetoresistance effect element.

On the other hand, when patterning the stacked body including the two free magnetic layers into the desired size, the patterning is easier by patterning the side walls of the free magnetic layers into tapered configurations. It becomes particularly difficult to pattern the side walls into perpendicular configurations in the case where the element size is small. Accordingly, it is practical to pattern the side surface of the stacked body into a tapered configuration in the case where the element size is reduced to obtain high reproduction resolution. In the case where the side surface of the stacked body is patterned into the tapered configuration, the size (the surface area) of the magnetic layer on the upper side is different from the size (the surface area) of the magnetic layer on the lower side.

In the embodiment, the distances from the two free magnetic layers (the fifth magnetic layer 35 and the sixth magnetic layer 36) to the magnetic layers (the first magnetic layer 11, the second magnetic layer 12, the third magnetic layer 23, and the fourth magnetic layer 24) arranged with the two free magnetic layers are different between the two free magnetic layers. In other words, as described above, the first distance d1 is set to be shorter than the second distance d2; and the third distance d3 is set to be shorter than the fourth distance d4.

In the embodiment, the unbalance of the average magnetic field strength (the magnetic field strength to suppress the magnetization switching noise) applied to the two free magnetic layers having mutually-different sizes (surface areas) can be improved. Thereby, the magnetization switching noise can be suppressed while maintaining the reproduction resolution and the linear response.

In the embodiment, the magnetization switching noise of the trilayer configuration can be suppressed. According to the embodiment, for example, the magnetic S/N ratio can be 30 decibels (dB) or more. Thereby, the noise can be sufficiently low during the usage as the reproducing head.

In the embodiment, as described above, the first magnetic layer 11 has exchange coupling with the first shield 71; and the third magnetic layer 23 has exchange coupling with the first shield 71. The second magnetic layer 12 has exchange coupling with the second shield 72; and the fourth magnetic layer 24 has exchange coupling with the second shield 72.

The first side magnetic unit 10 and the second side magnetic unit 20 function as magnetization switching noise suppression layers.

Exchange coupling includes, for example, direct coupling between a magnetic layer and a magnetic layer. Exchange coupling includes, for example, magnetic coupling between multiple magnetic layers that acts via an extremely thin nonmagnetic layer provided between the multiple magnetic layers. Exchange coupling is the effect via an interface between a magnetic layer and a magnetic layer or the effect via an interface between a magnetic layer and a nonmagnetic layer. In the case where the exchange coupling acts via the interface between the magnetic layer and the nonmagnetic layer, the exchange coupling depends on the film thickness of the nonmagnetic layer and acts when the thickness of the nonmagnetic layer is not more than 2 nm. Exchange coupling is different from the magnetostatic field coupling due to the leakage magnetic field from the end portion of the magnetic layer.

The exchange coupling energy may be considered to be a ferromagnetic coupling bias magnetic field or an antiferromagnetic coupling bias magnetic field acting between the magnetic layers. For example, in the case where there is no magnetic field bias applied from the outside, etc., the orientation of the magnetization can be aligned in the same orientation between the magnetic layers (a ferromagnetically-coupled state) or aligned in opposite orientations between the magnetic layers (an antiferromagnetically-coupled state) by the exchange coupling effect.

In the case where there is a magnetic field bias applied from the outside, etc., the magnetization is oriented in an orientation determined by the synthesis of the magnetic field of the magnetic field bias applied from the outside and the bias magnetic field due to the exchange coupling. Therefore, in the case where there is a magnetic field bias applied from the outside, etc., the ferromagnetic coupling bias magnetic field component or the antiferromagnetic coupling magnetic field component due to the exchange coupling acts. At this time, the orientation of the bias magnetic field due to the exchange coupling does not always match the orientation of the magnetization between the magnetic layers.

Examples of the components included in the magnetoresistance effect element according to the embodiment will now be described.

The sixth nonmagnetic layer 46 suppresses the exchange coupling between the fifth magnetic layer 35 and the first shield 71. The seventh nonmagnetic layer 47 suppresses the exchange coupling between the sixth magnetic layer 36 and the second shield 72. At least one selected from the sixth nonmagnetic layer 46 and the seventh nonmagnetic layer 47 includes, for example, at least one selected from Ta, Cu, Ru, Au, Ag, Rh, Pt, Pd, Cr, and Ir. At least one selected from the sixth nonmagnetic layer 46 and the seventh nonmagnetic layer 47 may include a stacked film including at least two films selected from a Ta film, a Cu film, a Ru film, a Au film, a Ag film, a Rh film, a Pt film, a Pd film, a Cr film, a film, and an Ir film.

For example, at least one selected from the sixth nonmagnetic layer 46 and the seventh nonmagnetic layer 47 may include a stacked film of a Ta layer (e.g., having a thickness of about 2 nm) and a Cu layer (e.g., having a thickness of about 2 nm).

In the case where a single-layer film of one selected from Cu, Ru, Au, Ag, Rh, Pt, Pd, Cr, and Ir is used as the at least one selected from the sixth nonmagnetic layer 46 and the seventh nonmagnetic layer 47, it is favorable for the thickness of the single-layer film to be 2 nm or more. The thickness of the at least one selected from the sixth nonmagnetic layer 46 and the seventh nonmagnetic layer 47 is, for example, not less than 2 nm and not more than 3 nm. Thereby, the exchange coupling between the fifth magnetic layer 35 and the first shield 71 is suppressed appropriately; and the exchange coupling between the sixth magnetic layer 36 and the second shield 72 is suppressed appropriately.

When the fifth magnetic layer 35 and the first shield 71 have exchange coupling and the sixth magnetic layer 36 and the second shield 72 have exchange coupling, the magnetization of the fifth magnetic layer 35 and the magnetization of the sixth magnetic layer 36 no longer move easily. The shield function degrades; and the resolution as the reproducing head decreases.

In the case where the strength |Jex| of the exchange coupling between the fifth magnetic layer 35 and the first shield 71 and the strength |Jex| of the exchange coupling between the sixth magnetic layer 36 and the second shield 72 are higher than 0.15 erg/cm$^2$ (ergs/square centimeter), the decrease of the resolution becomes pronounced. In the embodiment, the strengths of the exchange coupling between the fifth magnetic layer 35 and the first shield 71 and the exchange coupling between the sixth magnetic layer 36 and the second shield 72 are set to be 0.15 erg/cm$^2$ or less.

For example, a GMR effect occurs between the fifth magnetic layer 35 and the first shield 71 and between the sixth magnetic layer 36 and the second shield 72 when the fifth magnetic layer 35 and the first shield 71 are caused to have exchange coupling due to antiparallel coupling and the sixth magnetic layer 36 and the second shield 72 are caused to have exchange coupling due to antiparallel coupling. Therefore, the noise from the shields affects the reproduction characteristics and causes the S/N ratio when used as the reproducing head to decrease. When the S/N ratio decreases, the usage as the reproducing head becomes difficult.

Accordingly, materials and configurations are applied to the sixth nonmagnetic layer 46 and the seventh nonmagnetic layer 47 to suppress the exchange coupling between the fifth magnetic layer 35 and the first shield 71 and suppress the exchange coupling between the sixth magnetic layer 36 and the second shield 72.

By applying the materials and thicknesses recited above to the sixth nonmagnetic layer 46 and the seventh nonmagnetic layer 47, good crystal orientation of the magnetoresistance effect portion can be ensured while suppressing the resolution decrease due to the shield function degradation of the first shield 71 and the second shield 72. Thereby, a sufficient magnetoresistance effect is obtained; and highly-sensitive reproduction characteristics are obtained.

At least one selected from the fifth magnetic layer 35 and the sixth magnetic layer 36 includes, for example, at least one selected from CoFe, CoFeB, CoFeNi, CoFeSi, CoFeGe, CoFeSiGe, Co$_2$MnSi, Co$_2$MnGe, NiFe, CoFeMnSi, CoFeMnGe, and FeO$_x$ (Fe oxide). At least one selected from the fifth magnetic layer 35 and the sixth magnetic layer 36 may include, for example, a stacked film including at least two films selected from a CoFe film, a CoFeB film, a CoFeNi film, a CoFeSi film, a CoFeGe film, a CoFeSiGe film, a Co$_2$MnSi film, a Co$_2$MnGe film, a NiFe film, a CoFeMnSi film, a CoFeMnGe film, and an FeO$_x$ film. The material of the fifth magnetic layer 35 may be the same as or different from the material of the sixth magnetic layer 36. The material of the fifth magnetic layer 35 and the material of the sixth magnetic layer 36 are designed to match the magnetoresistance effect magnitude that is obtained. For example, the fifth magnetic layer 35 may include CoFeMnSi; and the sixth magnetic layer 36 may include CoFeSi.

It is favorable for the thickness of the fifth magnetic layer 35 and the thickness of the sixth magnetic layer 36 to be not more than 9 nm each. The thickness of the fifth magnetic layer 35 may be the same as or different from the thickness of the sixth magnetic layer 36.

The product (Ms·V) of a saturation magnetization Ms of the ferromagnetic layer and a volume V of the ferromagnetic layer is referred to as the magnetic volume. The surface area and thickness of the fifth magnetic layer 35 and the surface area and thickness of the sixth magnetic layer 36 may be determined such that the magnetic volume of the fifth magnetic layer 35 is substantially the same as the magnetic volume of the sixth magnetic layer 36. For example, the magnetic volume of the fifth magnetic layer 35 is not less than 0.6 times the magnetic volume of the sixth magnetic layer 36 and not more than 0.95 times the magnetic volume of the sixth magnetic layer 36.

In such a case as well, it is favorable for the thickness of the fifth magnetic layer 35 and the thickness of the sixth magnetic layer 36 to be set to be not more than 9 nm each. In the case where the thicknesses are thicker than 9 nm, it becomes difficult to dispose the magnetoresistance effect portion inside the gap (the space between the first shield 71 and the second shield 72) specified by the surface recording density. The reproduction resolution decreases in the case where the distance between the first shield 71 and the second shield 72 is large.

As described below, the stacked body 30 is formed by, for example, stacking a film that is used to form the fifth magnetic layer 35, a film that is used to form the third intermediate layer 30i, and a film that is used to form the sixth magnetic layer 36; by forming an etching mask on the stacked films; and by performing etching. At this time, as described above, the side wall of the stacked body 30 is patterned into a tapered configuration. Therefore, the width of the sixth magnetic layer 36 in the track width direction is narrower than the width of the fifth magnetic layer 35 in the track width direction. In practice, it is difficult to form these widths to be the same.

A first width RW1 of the fifth magnetic layer 35 in the track width direction is the length of the fifth magnetic layer 35 in the second direction (the Y-axis direction) recited above. The first width RW1 is the width of the fifth magnetic layer 35 in the second direction (the Y-axis direction) in the first plane PL1 perpendicular to the stacking direction (the first direction) and passing through the first center 35c of the fifth magnetic layer 35.

A second width RW2 of the sixth magnetic layer 36 in the track width direction is the length of the sixth magnetic layer 36 in the second direction (the Y-axis direction) recited above. The second width RW2 is the width of the sixth magnetic layer 36 in the second direction (the Y-axis direction) in the second plane PL2 perpendicular to the stacking direction (the first direction) and passing through the second center 36c of the sixth magnetic layer 36.

The second width RW2 is narrower than the first width RW1. A ratio RRW of the second width RW2 to the first width RW1 (i.e., RW2/RW1) is not less than 0.5 and not more than 0.9. When the ratio RRW is less than 0.5, for example, the magnetization amounts occurring at the surfaces of the second magnetic layer 12 and the fourth magnetic layer 24 opposing the sixth magnetic layer 36 become small. Also, the magnetization amounts occurring at the surfaces of the first magnetic layer 11 and the third magnetic layer 23 opposing the fifth magnetic layer 35 become small. Therefore, the strength of the magnetization switching noise suppression magnetic field applied to the sixth magnetic layer 36 by the second magnetic layer 12 and the fourth magnetic layer 24 becomes small. Further, the strength of the magnetization switching noise suppression magnetic field applied to the fifth magnetic layer 35 by the first magnetic layer 11 and the third magnetic layer 23 becomes small. In the case where the strength of the magnetization switching noise suppression magnetic field is insufficient, the reduction effect of the magnetic S/N ratio (the heat fluctuation S/N ratio) due to the magnetization switching noise becomes small.

The thickness of the third intermediate layer 30i is, for example, not more than 3.5 nm. The third intermediate layer 30i includes, for example, at least one selected from Cu, Ru, Au, Ag, Zn, Ga, $TiO_x$, ZnO, $Al_2O_3$, MgO, InO, SnO, GaN, and ITO (Indium Tin Oxide). The third intermediate layer 30i may include, for example, a stacked film including at least two films selected from a Cu film, a Ru film, a Au film, a Ag film, a Zn film, a Ga film, a $TiO_x$ film, a ZnO film, an $Al_2O_3$ film, a MgO film, an InO film, a SnO film, a GaN film, and an ITO film.

Good spin polarization is obtained by using the fifth magnetic layer 35, the sixth magnetic layer 36, and the third intermediate layer 30i such as those recited above. Thereby, high sensitivity can be obtained.

At least one selected from the first shield 71 and the second shield 72 includes at least one selected from NiFe, CoZrTa, CoZrNb, CoZrNbTa, CoZrTaCr, and CoZrFeCr. At least one selected from the first shield 71 and the second shield 72 may include a stacked film including at least two films selected from a NiFe film, a CoZrTa film, a CoZrNb film, a CoZrNbTa film, a CoZrTaCr film, and a CoZrFeCr film.

The first shield 71 shields, for example, the magnetic fields from the adjacent bits existing on the same track in the magnetic recording medium 80. Further, for example, the first shield 71 is used as the path of a sense current flowing in the stacking direction in the stacked body 30 of the magnetoresistance effect element. The first shield 71 functions as an electrode. The first shield 71 includes, for example, an alloy layer of NiFe having a thickness of about 1 μm.

The second shield 72 shields, for example, the magnetic fields from the adjacent bits existing on the same track in the magnetic recording medium 80. Further, for example, the second shield 72 is used as the path of a sense current flowing in the stacking direction in the stacked body 30 of the magnetoresistance effect element. The second shield 72 functions as an electrode. The second shield 72 includes, for example, an alloy layer of NiFe having a thickness of about 1 μm.

An antiferromagnetic layer of IrMn may be provided in one selected from the first shield 71 and the second shield 72 to change the magnetization directions of the first shield 71 and the second shield 72.

The first magnetic layer 11 and the third magnetic layer 23 apply magnetization switching noise suppression magnetic fields to the fifth magnetic layer 35. The first magnetic layer 11 and the third magnetic layer 23 also function as side shields. It is favorable for the height position (the height along the X-axis direction) of the first magnetic layer 11 opposing the first intermediate layer 10i and the height position (the height along the X-axis direction) of the third magnetic layer 23 opposing the second intermediate layer 20i to be substantially the same as the height position (the height along the X-axis direction) of the fifth magnetic layer 35 opposing the third intermediate layer 30i. For example, the thickness of the first magnetic layer 11 and the thickness of the third magnetic layer 23 each are set to be not less than 0.8 times the thickness of the fifth magnetic layer 35 and not more than 1.2 times the thickness of the fifth magnetic layer 35. Thereby, the effect of the bias magnetic fields applied to the sixth magnetic layer 36 by the first magnetic layer 11 and the third magnetic layer 23 can be reduced.

The second magnetic layer 12 and the fourth magnetic layer 24 apply magnetization switching noise suppression magnetic fields to the sixth magnetic layer 36. The second magnetic layer 12 and the fourth magnetic layer 24 also function as side shields. It is favorable for the height position (the height along the X-axis direction) of the second magnetic layer 12 opposing the first intermediate layer 10i and the height position (the height along the X-axis direction) of the fourth magnetic layer 24 opposing the second intermediate layer 20i to be substantially the same as the height position (the height along the X-axis direction) of the sixth magnetic layer 36 opposing the third intermediate layer 30i. For example, the thickness of the second magnetic layer 12 and the thickness of the fourth magnetic layer 24 each are set to be not less than 0.8 times the thickness of the sixth magnetic layer 36 and not more than 1.2 times the thickness of the sixth magnetic layer 36. Thereby, the effect of the bias magnetic fields applied to the fifth magnetic layer 35 by the second magnetic layer 12 and the fourth magnetic layer 24 can be reduced.

At least one selected from the first magnetic layer 11, the second magnetic layer 12, the third magnetic layer 23, and the fourth magnetic layer 24 includes at least one selected from NiFe, CoZrTa, CoZrNb, CoZrNbTa, CoZrTaCr, and CoZrFeCr. At least one selected from the first magnetic layer 11, the second magnetic layer 12, the third magnetic layer 23, and the fourth magnetic layer 24 may include a stacked film including at least two films selected from a NiFe film, a CoZrTa film, a CoZrNb film, a CoZrNbTa film, a CoZrTaCr film, and a CoZrFeCr film. It is favorable for at least one selected from the first magnetic layer 11, the second magnetic layer 12, the third magnetic layer 23, and the fourth magnetic layer 24 to include at least one selected from amorphous CoZrTa, amorphous CoZrNb, amorphous CoZrNbTa, amorphous CoZrTaCr, and amorphous CoZrFeCr.

The first magnetic layer 11, the second magnetic layer 12, the third magnetic layer 23, and the fourth magnetic layer 24 may include the same material or may include mutually-different materials. For example, the first magnetic layer 11 and the third magnetic layer 23 may include NiFe; and the second magnetic layer 12 and the fourth magnetic layer 24 may include CoZrNb.

It is favorable for the first magnetic layer 11, the second magnetic layer 12, the third magnetic layer 23, and the fourth magnetic layer 24 to have a high saturation magnetization value and good soft magnetic properties. For these magnetic layers, it is favorable for the saturation magnetization to be 1.0 T (teslas) or more. It is possible to primarily determine the value of the saturation magnetization by, for example, obtaining information relating to the material composition and the crystallinity (including the amorphous state) of the magnetic layer by cross section TEM-EDX, etc. For example, the saturation magnetization of amorphous CoZrTa is about 1.0 T.

As described above, it is favorable for the first magnetic layer 11 and the third magnetic layer 23 to have exchange coupling with the first shield 71. To adjust the exchange coupling strength and the orientation of the exchange coupling, a first exchange coupling adjustment layer (not shown) may be provided between the first shield 71 and the first magnetic layer 11 and between the first shield 71 and the third magnetic layer 23. The thickness of the first exchange coupling adjustment layer is, for example, not more than 2 nm. The first exchange coupling adjustment layer may include, for example, at least one selected from the group consisting of Cu, Ru, Au, Ag, Rh, Pt, Pd, Cr, and Ir.

Similarly, it is favorable for the second magnetic layer 12 and the fourth magnetic layer 24 to have exchange coupling with the second shield 72. To adjust the exchange coupling strength and the orientation of the exchange coupling, a second exchange coupling adjustment layer (not shown) may be provided between the second shield 72 and the second magnetic layer 12 and between the second shield 72 and the fourth magnetic layer 24. The configuration described in regard to the first exchange coupling adjustment layer is applicable to the configuration (e.g., the thickness and the material) of the second exchange coupling adjustment layer.

For example, the saturation magnetic flux density of the sixth magnetic layer 36 is set to be substantially the same as the saturation magnetic flux density of the fifth magnetic layer 35. Then, the track width (the second width RW2) of the sixth magnetic layer 36 is narrower than the track width (the first width RW1) of the fifth magnetic layer 35. In such a case, if the first distance d1 is the same as the second distance d2 and the third distance d3 is the same as the fourth distance d4, the average magnetization switching noise suppression magnetic field strength per unit volume from the magnetization switching noise suppression layers is undesirably greatly different between the fifth magnetic layer 35 and the sixth magnetic layer 36. In other words, the average strength of the magnetization switching noise suppression magnetic field per unit volume on the fifth magnetic layer 35 from the first side magnetic unit 10 (a first magnetization switching noise suppression layer) and the second side magnetic unit 20 (a second magnetization switching noise suppression layer) is undesirably greatly different from the average strength of the magnetization switching noise suppression magnetic field per unit volume on the sixth magnetic layer 36 from the first side magnetic unit 10 (the first magnetization switching noise suppression layer) and the second side magnetic unit 20 (the second magnetization switching noise suppression layer). Therefore, it is difficult to obtain a sufficient magnetization switching noise suppression effect.

To obtain a sufficient magnetization switching noise suppression effect, it is favorable for the average strength of the magnetization switching noise suppression magnetic field to be substantially the same for the fifth magnetic layer 35 and the sixth magnetic layer 36 which have mutually-different sizes.

In the embodiment, the track width (the second width RW2) of the sixth magnetic layer 36 is set to be narrower than the track width (the first width RW1) of the fifth magnetic layer 35; the first distance d1 is set to be shorter than the second distance d2; and the third distance d3 is set to be shorter than the fourth distance d4. In other words, the distance ratios (d2/d1 and d4/d3) are adjusted to match the ratio RRW (i.e., RW2/RW1) of the widths of the fifth magnetic layer 35 and the sixth magnetic layer 36 in the track width direction. For example, d2/d1 and d4/d3 are not less than 1.2 and not more than 2.4.

Thereby, for example, a value (a first value) of the bias strength applied to the fifth magnetic layer 35 by the first magnetic layer 11 divided by the volume of the fifth magnetic layer 35 can be substantially the same as a value (a second value) of the bias strength applied to the sixth magnetic layer 36 by the second magnetic layer 12 divided by the volume of the sixth magnetic layer 36. For example, the first value can be not less than 0.8 times the second value and not more than 1.2 times the second value.

Thereby, a low-noise magnetoresistance effect element can be provided.

The electrical resistances of the first to fourth nonmagnetic layers 41 to 44 are higher than the electrical resistance of the stacked body 30 (the magnetoresistance effect unit). At least one selected from the first to fourth nonmagnetic layers 41 to 44 may include at least one selected from a metal oxide, a metal nitride, and a metal oxynitride. At least one selected from the first to fourth nonmagnetic layers 41 to 44 may include at least one selected from silicon oxide (e.g., $SiO_2$), silicon nitride, silicon oxynitride, aluminum oxide (e.g., $Al_2O_3$), aluminum nitride, and aluminum oxynitride. At least one selected from the first to fourth nonmagnetic layers 41 to 44 may include, for example, at least one selected from the group consisting of Cu, Ru, Au, Ag, Rh, Pt, Pd, Cr, and Ir. Further, a stacked film of the multiple films of the materials recited above may be used.

For example, the second nonmagnetic layer 42 may include a material that is the same as or different from that of the first nonmagnetic layer 41. The fourth nonmagnetic layer 44 may include a material that is the same as or different from that of the third nonmagnetic layer 43. It is favorable for the second nonmagnetic layer 42 to have the same material and the same thickness as the first nonmagnetic layer 41. It is favorable for the fourth nonmagnetic layer 44 to have the same material and the same thickness as the third nonmagnetic layer 43. Thereby, the manufacturing is easier.

The thickness of the first nonmagnetic layer 41, the thickness of the second nonmagnetic layer 42, the thickness of the third nonmagnetic layer 43, and the thickness of the fourth nonmagnetic layer 44 are set to obtain the distance ratios (d2/d1 and d4/d3) specified from the strength of the magnetization switching noise suppression magnetic field. It is favorable for these thicknesses to be, for example, not less than 0.5 nm and not more than 5 nm each. Thereby, the strength of the magnetization switching noise suppression magnetic field due to the first side magnetic unit 10 and the second side magnetic unit 20 can be set to the desired value while maintaining the dispositions opposing the free magnetic layers inside the gap between the first shield 71 and the second shield 72.

In the embodiment, the unbalance of the average strengths of the magnetization switching noise suppression magnetic fields applied to the free magnetic layers which have mutually-different sizes can be improved. Thereby, the magnetization switching noise can be suppressed while maintaining the reproduction resolution and the linear response.

An example of a method for manufacturing the magnetoresistance effect element according to the embodiment will now be described.

FIG. 5A to FIG. 5J are schematic cross-sectional views illustrating the method for manufacturing the magnetoresistance effect element according to the first embodiment.

These drawings correspond to, for example, cross-sectional views when cut by a plane parallel to the medium-opposing surface 70s.

FIG. 6A to FIG. 6D are schematic cross-sectional views illustrating the method for manufacturing the magnetoresistance effect element according to the first embodiment.

These drawings correspond to, for example, cross-sectional views when cut by a plane orthogonal to the medium-opposing surface 70s. The processes illustrated in FIG. 6A to FIG. 6D are implemented between the process illustrated in FIG. 5I and the process illustrated in FIG. 5J.

As shown in FIG. 5A, the first shield 71 is formed on a substrate 78 by, for example, plating. For example, a NiFe film (an alloy film) that is used to form the first shield 71 is formed with a thickness of about 1 μm. In the first shield 71, an antiferromagnetic layer of IrMn may be stacked with the NiFe film. For example, the IrMn film may be formed on the substrate 78 by sputtering; and subsequently, the NiFe film that is used to form the first shield 71 may be formed on the IrMn film.

As shown in FIG. 5B, a sixth nonmagnetic film 46f that is used to form the sixth nonmagnetic layer 46, a fifth magnetic film 35f that is used to form the fifth magnetic layer 35, a third intermediate film 30if that is used to form the third intermediate layer 30i, a sixth magnetic film 36f that is used to form the sixth magnetic layer 36, and a seventh nonmagnetic film 47f that is used to form the seventh nonmagnetic layer 47 are formed in this order on the first shield 71 by sputtering.

For example, a stacked film of, for example, a Ta film having a thickness of 2 nm and a Cu film having a thickness of 2 nm formed on the Ta film is formed as the sixth nonmagnetic film 46f. For example, a stacked film of a Cu film having a thickness of 2 nm and a Ta film having a thickness of 2 nm formed on the Cu film is formed as the seventh nonmagnetic film 47f. For example, a Cu film having a thickness of 2 nm is formed as the third intermediate film 30if. For example, CoFeMnSi films having thicknesses of 6 nm are formed as the fifth magnetic film 35f and the sixth magnetic film 36f, respectively.

As shown in FIG. 5C, a first mask M1 is disposed on the seventh nonmagnetic film 47f; and etching is performed. Thereby, the sixth nonmagnetic layer 46, the fifth magnetic layer 35, the third intermediate layer 30i, the sixth magnetic layer 36, and the seventh nonmagnetic layer 47 are formed. In the example, the first mask M1 is separated from the seventh nonmagnetic film 47f. For example, IBE (Ion Beam Etching) is used in the etching. The first mask M1 includes, for example, a photoresist. The first mask M1 may include, for example, a hard mask. The hard mask may include one selected from the group consisting of C (carbon), Si, and Al, an oxide of one selected from the group, or a nitride of one selected from the group. In the case where the photoresist is used as the first mask M1, the removal of the first mask M1 is easier by applying a structure including undercut.

In the case where IBE is used to perform the etching, the taper angle of the magnetoresistance effect portion (the stacked body 30) can be adjusted by changing the beam angle. The taper angle is the angle between the Y-Z plane and the side surface of the stacked body 30. As the angle between the beam and the X-axis direction is reduced, the taper angle decreases, that is, the angle between the Y-Z plane and the side surface of the stacked body 30 decreases. In the IBE, it is difficult for the taper angle to be 90 degrees (a perpendicular side surface) due to re-adhering material. The taper angle of the stacked body 30 is practically, for example, not less than 55 degrees and not more than 85 degrees.

As shown in FIG. 5D, a first nonmagnetic film 41f that is used to form the first nonmagnetic layer 41 and the third nonmagnetic layer 43 is formed on the patterning body. For example, an $Al_2O_3$ film having a thickness of 2 nm is formed by, for example, ALD (Atomic Layer Deposition). For example, a uniform film is obtained on the side surface of the stacked body 30 by ALD to form the first nonmagnetic film 41f. Sputtering may be used to form the first nonmagnetic film 41f.

As shown in FIG. 5E, the first nonmagnetic film 41f that is formed on portions other than the side wall of the stacked body 30 is removed by IBE. Thereby, the first nonmagnetic layer 41 and the second nonmagnetic layer 42 are formed.

As shown in FIG. 5F, a first magnetic film 11f that is used to form the first magnetic layer 11 and the third magnetic layer 23 is formed by, for example, sputtering. A NiFe film is formed as the first magnetic film 11f. The thickness of the first magnetic film 11f is set to be, for example, not less than 0.8 times and not more than 1.2 times the distance between the first shield 71 upper surface and the portion of the fifth magnetic layer 35 on the side opposing the third intermediate layer 30i.

As shown in FIG. 5G, a first intermediate film 10if that is used to form the first intermediate layer 10i and the second intermediate layer 20i is formed by, for example, ALD on the first magnetic film 11f, on the first nonmagnetic layer 41 on the side surface of the stacked body 30, and on the second nonmagnetic layer 42 on the side surface of the stacked body 30. For example, an $Al_2O_3$ film is formed with a thickness of 1.5 nm as the first intermediate film 10if. In the example, the first intermediate film 10if also is used to form a portion of the third nonmagnetic layer 43 and a portion of the fourth nonmagnetic layer 44. In other words, the portion of the first intermediate film 10if that is formed on the first magnetic film 11f is used to form the first intermediate layer 10i and the second intermediate layer 20i. The portions of the first intermediate film 10if formed respectively on the first nonmagnetic layer 41 and the second nonmagnetic layer 42 on the side surfaces of the stacked body 30 are used to form a portion of the third nonmagnetic layer 43 and a portion of the fourth nonmagnetic layer 44, respectively.

Sputtering may be used to form the first intermediate film 10if. In the case where sputtering is used, it is possible to adjust the sputtering angle. By adjusting the sputtering angle, the balance between the thickness of the portion of the first intermediate film 10if on the first magnetic film 11f and the thickness of the portion of the first intermediate film 10if on the side surface of the stacked body 30 can be changed. For example, when the sputtering angle is 60 degrees, the thickness of the portion of the first intermediate film 10if on the first magnetic film 11f can be substantially the same as the thickness of the portion of the first intermediate film 10if on the side surface of the stacked body 30. For example, when the sputtering angle is 10 degrees, the first intermediate film 10*if* is formed selectively on the first magnetic film 11*f* due to the shadow effect of the first mask M1. In other words, the first intermediate film 10*if* is substantially not formed on the side surface of the stacked body 30.

As shown in FIG. 5H, a second magnetic film 12*f* that is used to form the second magnetic layer 12 and the fourth magnetic layer 24 is formed by, for example, sputtering. For example, a NiFe film is formed as the second magnetic film 12*f*.

As shown in FIG. 5I, the first mask M1 is removed.

As shown in FIG. 6A, a second mask M2 is formed on the stacked body 30. The configuration (e.g., the material, etc.) described in regard to the first mask M1 is applicable to the second mask M2. The configuration of the second mask M2 is different from the configuration of the first mask M1. Further, a portion of the magnetoresistance effect portion (the stacked body 30) is removed by, for example, IBE using the second mask M2 as a mask.

As shown in FIG. 6B, a fifth nonmagnetic film 45*f* that is used to form the fifth nonmagnetic layer 45 is formed on the side surface of the stacked body 30 and on the first shield 71. For example, ALD is used to form the fifth nonmagnetic film 45*f*. For example, an $Al_2O_3$ film is formed with a thickness of 3 nm as the fifth nonmagnetic film 45*f*.

Also, a foundation layer (not shown) of, for example, a Cr film having a thickness of 3 nm may be formed by sputtering.

As shown in FIG. 6C, a hard bias film 75*f* that is used to form the hard bias unit 75 is formed. For example, a $CoPt_{30}$ film having a thickness of 25 nm is formed by, for example, sputtering as the hard bias film 75*f*.

As shown in FIG. 6D, the second mask M2 is removed.

As shown in FIG. 5J, a second shield film 72*f* that is used to form the second shield 72 is formed. The second shield film 72*f* is formed by, for example, plating. For example, a NiFe film is formed as the second shield film 72*f*.

Subsequently, the patterning body is divided into each of the elements; and the medium-opposing surface 70*s* is formed on the divided patterning bodies by, for example, polishing.

The magnetoresistance effect element 210 of the embodiment is formed by a manufacturing method such as that described above.

An example of characteristics of the magnetoresistance effect element 210 according to the embodiment will now be described.

The magnetoresistance effect element 210 is made by the manufacturing method recited above. In the example, the following conditions are used.

NiFe is used as the first shield 71 and the second shield 72. A stacked film of a Ta film having a thickness of 2 nm and a Cu film having a thickness of 2 nm provided on the Ta film is used as the sixth nonmagnetic layer 46. A CoFeMnSi film having a thickness of 6 nm is used as the fifth magnetic layer 35. A Cu film having a thickness of 2 nm is used as the third intermediate layer 30*i*. A CoFeMnSi film having a thickness of 6 nm is used as the sixth magnetic layer 36. A stacked film of a Cu film having a thickness of 2 nm and a Ta film having a thickness of 2 nm provided on the Cu film is used as the seventh nonmagnetic layer 47. NiFe is used as the first magnetic layer 11, the second magnetic layer 12, the third magnetic layer 23, the fourth magnetic layer 24. $Al_2O_3$ is used as the first nonmagnetic layer 41, the second nonmagnetic layer 42, the third nonmagnetic layer 43, the fourth nonmagnetic layer 44, the fifth nonmagnetic layer 45. $CoPt_{30}$ is used as the hard bias unit 75.

From the results of cross section TEM microscopy of the magnetoresistance effect element 210 that is made, the first width RW1 of the fifth magnetic layer 35 in the track width direction is 30 nm; and the second width RW2 of the sixth magnetic layer 36 in the track width direction is 24 nm. In other words, the ratio RRW (i.e., RW2/RW1) of the widths of the fifth magnetic layer 35 and the sixth magnetic layer 36 in the track width direction is about 0.8. The surface area ratio (S2/S1) of the fifth magnetic layer 35 and the sixth magnetic layer 36 is about 0.7. The value of d2/d1 and the value of d4/d3 which are the distance ratios for the fifth magnetic layer 35 and the sixth magnetic layer 36 are about 1.2.

In measurements of the characteristics of such a magnetoresistance effect element 210, a voltage of 50 mV is applied by using the first shield 71 and the second shield 72 as electrodes; an external magnetic field is changed in the range of ±600 oersted (Oe); and the signal (the output voltage) that is obtained is measured. In the measurements, the change of the output voltage is statically measured while changing the external magnetic field in 100 Oe steps.

The output voltage when the external magnetic field is +600 Oe is referred to as a first voltage V1; and the output voltage when the external magnetic field is −600 Oe is referred to as a second voltage V2. The absolute value of the difference between the first voltage V1 and the second voltage V2 is referred to as a signal strength V12. A linear parameter LV is calculated as an evaluation value of the linear response. The linear parameter LV is (V1−V2)/(V1+V2). It is favorable for the signal strength V12 to be large. From the aspect of the linear response, it is favorable for the absolute value of the linear parameter LV to be small (close to 0%).

In the evaluation of the characteristics of the magnetoresistance effect element 210 according to the embodiment, the signal strength V12 is 1.5 mV. The linear parameter LV is 10%.

Further, to evaluate the magnetic S/N ratio (the heat fluctuation S/N ratio) and the existence or absence of magnetization switching noise, frequency component analysis of the output voltage is performed at the condition of an external magnetic field of 0 Oe. In the analysis, the integral of frequency components of the output voltage of 1 GHz or less is taken to be the noise component.

For the magnetoresistance effect element 210, a distinct noise signal component having a frequency of 1 GHz or less is not observed. The magnetic S/N ratio (the heat fluctuation S/N ratio) determined from the signal strength V12 that is obtained (the voltage difference for external magnetic fields of ±600 Oe) and the noise component signal strength (the integral of frequency components of 1 GHz or less) is 32 dB.

On the other hand, a magnetoresistance effect element 219*a* of a first reference example (for which the structure is not shown) is made in which the first side magnetic unit 10 and the second side magnetic unit 20 are not provided. In the element, $Al_2O_3$ layers are provided instead of the first side magnetic unit 10 and the second side magnetic unit 20 at the locations of the first side magnetic unit 10 and the second side magnetic unit 20. Otherwise, the configuration of the magnetoresistance effect element 219*a* is the same as that of the magnetoresistance effect element 210. The magnetoresistance effect element 219*a* is made by forming the $Al_2O_3$ layers in the processes of FIG. 5E to FIG. 5H.

In the magnetoresistance effect element 219*a*, the signal strength V12 is 1.7 my; and the linear parameter LV is 24%. A characteristic noise frequency component was observed at frequencies of 1 GHz or less from the results of the frequency component analysis. The magnetic S/N ratio is 21 dB.

A simulation using a model of the structure of the magnetoresistance effect element 219a was implemented to examine the reason that the characteristic noise frequency component occurs at frequencies of 1 GHz or less and the magnetic S/N ratio decreases drastically. The values of the materials used in the experiments are used as the parameters of the layers inside the element in the simulation. Data relating to the configuration obtained from the results of the cross section TEM and the SEM analysis is used for the configuration of the model of the simulation.

In the results of the simulation, the magnetic S/N ratio of the magnetoresistance effect element 219a is 22 dB. The value of the simulation results matches the experimental value well. In the frequency component analysis of the simulation as well, a characteristic noise frequency component occurs at frequencies of 1 GHz or less. Thus, it can be seen that the simulation reproduces the experimental results well.

When the behavior of the magnetizations of the fifth magnetic layer 35 and the sixth magnetic layer 36 were examined by calculating the time dependency of the output of the simulation, it was found that the magnetization directions interchange without a correlation to time. In other words, it was found that a magnetization switching phenomenon is occurring.

When reproducing the experimental results by simulation for the configuration of the magnetoresistance effect element 210 according to the embodiment, the magnetic S/N ratio is 33 dB. Also, a characteristic noise component signal is not observed at frequencies of 1 GHz or less. The magnetization switching phenomenon also is not confirmed. Thus, the simulation reproduces the experimental results well.

Thus, it can be seen from the experimental results and simulations that the characteristic noise frequency component at frequencies of 1 GHz or less in the frequency component analysis is due to the magnetization switching phenomenon. The magnetization switching phenomenon is the reason that the magnetic S/N ratio is low in the magnetoresistance effect element 219a.

Thus, the magnetization switching phenomenon described in regard to FIG. 4A that was discovered by the inventor of the application is supported by the experiments and the simulations.

A magnetoresistance effect element 219b of a second reference example (for which the structure is not shown) will now be described. In the magnetoresistance effect element 219b, the first side magnetic unit 10 and the second side magnetic unit 20 are provided; the first distance d1 is the same as the second distance d2; and the third distance d3 is the same as the fourth distance d4. Otherwise, the configuration of the magnetoresistance effect element 219b is the same as that of the magnetoresistance effect element 210. In other words, in the magnetoresistance effect element 219b, the surface area is different between the fifth magnetic layer 35 and the sixth magnetic layer 36; and the distances recited above are the same.

Such a magnetoresistance effect element 219b is formed by forming the first intermediate film 10if by sputtering. The first intermediate film 10if is formed selectively on the first magnetic film 11f by adjusting the sputtering angle. In other words, the first intermediate film 10if is substantially not formed on the side surface of the stacked body 30.

From the results of cross section TEM microscopy of the magnetoresistance effect element 219b that is made, the first width RW1 is 30 nm; the second width RW2 is 24 nm; and the ratio RRW (i.e., RW2/RW1) is 0.8. On the other hand, the first to fourth distances d1 to d4 are 3 nm.

In the magnetoresistance effect element 219b, the signal strength V12 is 1.2 my; and the linear parameter LV is 13%. From the results of the frequency component analysis, the magnetic S/N ratio is 24 dB. The magnetic S/N ratio obtained by simulation is 24 dB.

The values of the magnetic S/N ratio for the magnetoresistance effect element 210, the magnetoresistance effect element 219a, and the magnetoresistance effect element 219b correlate with the values of the noise frequency component strength at frequencies or 1 GHz or less from the frequency component analysis of the simulations. It was found that the magnetic S/N ratio can be improved by reducing the occurrence frequency of the magnetization switching phenomenon.

The magnetization switching phenomenon can be suppressed by providing the first side magnetic unit 10 and the second side magnetic unit 20; and the magnetic S/N ratio is better for the magnetoresistance effect element 219b than for the magnetoresistance effect element 219a. However, in the magnetoresistance effect element 219b as well, the suppression of the magnetization switching phenomenon is insufficient. In other words, in the case where the ratios (d2/d1 and d3/d4) of the opposing distances are 1, the occurrence of the magnetization switching phenomenon cannot be suppressed sufficiently.

In the embodiment, the ratios of the opposing distances are set to be less than 1, that is, d2>d1 and d4>d3. Thereby, the average strengths of the magnetization switching noise suppression magnetic fields applied to the fifth magnetic layer 35 and the sixth magnetic layer 36 can be substantially the same. Thereby, the magnetization switching phenomenon can be suppressed sufficiently. By setting the ratios of the opposing distances to be less than 1, the magnetic S/N ratio can be improved uniquely.

Using the configuration of the magnetoresistance effect element 210 as a model, the magnetic S/N ratio is determined by simulation by changing the ratio d2/d1 (and the ratio d4/d3). In such a case, the value of the ratio RRW (RW2/RW1) is changed in a range not less than 0.5 and not more than 0.8 to correspond to the value of the ratio d2/d1. The values of the magnetic S/N ratios that are obtained are as follows.

The magnetic S/N ratio is 24 dB when the ratio d2/d1 is 1.0.
The magnetic S/N ratio is 32 dB when the ratio d2/d1 is 1.2.
The magnetic S/N ratio is 32 dB when the ratio d2/d1 is 2.6.
The magnetic S/N ratio is 31 dB when the ratio d2/d1 is 2.0.
The magnetic S/N ratio is 30 dB when the ratio d2/d1 is 2.4.
The magnetic S/N ratio is 22 dB when the ratio d2/d1 is 2.6.

Thus, the magnetic S/N ratio drastically improves when the ratio d2/d1 (and d4/d3) is not less than 1.2 and not more than 2.4.

The characteristics of the magnetoresistance effect element when the material of the first magnetic layer 11, the second magnetic layer 12, the third magnetic layer 23, and the fourth magnetic layer 24 is changed will now be described.

The first magnetic layer 11, the second magnetic layer 12, the third magnetic layer 23, and the fourth magnetic layer 24 include a soft magnetic material. NiFe is used as the soft magnetic material in the description recited above. The magnetic S/N ratio can be improved even when using an amorphous form of CoZrTa, CoZrNb, CoZrNbTa, CoZrTaCr, or CoZrFeCr as the soft magnetic material.

The reproduction resolution (nm) in the track width direction is determined from the evaluation results of the characteristics when these materials are used. The reproduction resolution in the track width direction is evaluated by measuring the micro-track profile using a spinstand. Being able to resolve a finer track corresponds to the resolution being high.

Taking the value of the reproduction resolution (the finest track width value that can be resolved) when NiFe is used as the soft magnetic material to be 1, the relative values of the reproduction resolution for these materials are as follows. The reproduction resolution (the relative value) is 0.9 when amorphous CoZrTa is used as the soft magnetic material. The reproduction resolution (the relative value) is 0.7 when amorphous CoZrNb is used as the soft magnetic material. The reproduction resolution (the relative value) is 0.9 when amorphous CoZrTaCr is used as the soft magnetic material. The reproduction resolution (the relative value) is 1.0 when amorphous CoZrFeCr is used as the soft magnetic material.

Thus, in the case where NiFe, CoZrTa, CoZrNb, CoZrNbTa, CoZrTaCr, and CoZrFeCr are used as the soft magnetic material, there is almost no difference between the reproduction resolutions in the track width direction; and good resolution is obtained.

On the other hand, in the case where CoFe, Co, or Fe is used as the material of the first magnetic layer 11, the second magnetic layer 12, the third magnetic layer 23, and the fourth magnetic layer 24, the magnetic S/N ratio improves similarly to the description recited above; but the reproduction resolution (the relative value) in the track width direction is about 1.2. It is considered that this is because of the soft magnetic properties of CoFe.

Thus, a higher reproduction resolution is obtained when NiFe, CoZrTa, CoZrNb, CoZrNbTa, CoZrTaCr, or CoZrFeCr is used than when CoFe, Co, or Fe is used.

In the magnetoresistance effect element 210 according to the embodiment, the first width RW1 of the fifth magnetic layer 35 in the track width direction is not less than 15 nm and not more than 40 nm; and the second width RW2 of the sixth magnetic layer 36 in the track width direction is not less than 10 nm and not more than 30 nm. Thus, in the case where the width in the track width direction is narrow, the effect of the difference between the sizes of the fifth magnetic layer 35 and the sixth magnetic layer 36 on the characteristics is large.

For example, the second surface area S2 is not less than 0.7 times the first surface area S1 and not more than 0.9 times the first surface area S1. In such a case, for the first surface area S1, the second surface area S2, the first distance d1, and the second distance d2, S1×d1 is set to be, for example, not less than 0.8 times S2×d2 and not more than 1.2 times S2×d2.

It is favorable for the first distance d1 (and the third distance d3) to be not less than 1 nm and not more than 4 nm. It is favorable for the second distance d2 (and the fourth distance d4) to be not less than 2 nm and not more than 5 nm.

FIG. 7 is a schematic view illustrating another magnetoresistance effect element according to the first embodiment.

FIG. 7 is a cross-sectional view corresponding to the cross section along line A1-A2 of FIG. 1A.

In the magnetoresistance effect element 211 according to the embodiment as shown in FIG. 7, the first nonmagnetic layer 41 extends between the first shield 71 and the first magnetic layer 11; and the second nonmagnetic layer 42 extends between the first shield 71 and the third magnetic layer 23. The first magnetic layer 11 does not have exchange coupling with the first shield 71; and the third magnetic layer 23 does not have exchange coupling with the first shield 71. Otherwise, the configuration of the magnetoresistance effect element 211 is the same as that of the magnetoresistance effect element 210. The configurations described in regard to the magnetoresistance effect element 210 can be provided to the components included in the magnetoresistance effect element 211.

Thus, in the embodiment, the first magnetic layer 11 and the first shield 71 may or may not have exchange coupling; and the third magnetic layer 23 and the first shield 71 may or may not have exchange coupling.

In such a case as well, the exchange coupling between the second shield 72 and the second magnetic layer 12 and the exchange coupling between the second shield 72 and the fourth magnetic layer 24 are stronger than the exchange coupling between the second shield 72 and the sixth magnetic layer 36.

In the magnetoresistance effect element 211, it is favorable for the first nonmagnetic layer 41 and the second nonmagnetic layer 42 to include at least one selected from a metal oxide, a metal nitride, and a metal oxynitride. For example, it is favorable for the first nonmagnetic layer 41 and the second nonmagnetic layer 42 to include at least one selected from silicon oxide (e.g., $SiO_2$), silicon nitride, silicon oxynitride, aluminum oxide (e.g., $Al_2O_3$), aluminum nitride, and aluminum oxynitride.

On the other hand, it is favorable for the third nonmagnetic layer 43 and the fourth nonmagnetic layer 44 to include at least one selected from the group consisting of Cu, Ru, Au, Ag, Rh, Pt, Pd, Cr, and Ir. For example, the third nonmagnetic layer 43 and the fourth nonmagnetic layer 44 may include a stacked film including at least two films selected from a Cu film, a Ru film, a Au film, a Ag film, a Rh film, a Pt film, a Pd film, a Cr, and an Ir film.

In the magnetoresistance effect element 211 as well, the first distance d1 is set to be shorter than the second distance d2; and the third distance d3 is set to be shorter than the fourth distance d4. Thereby, a low-noise magnetoresistance effect element can be provided.

Second Embodiment

Figure 8A:
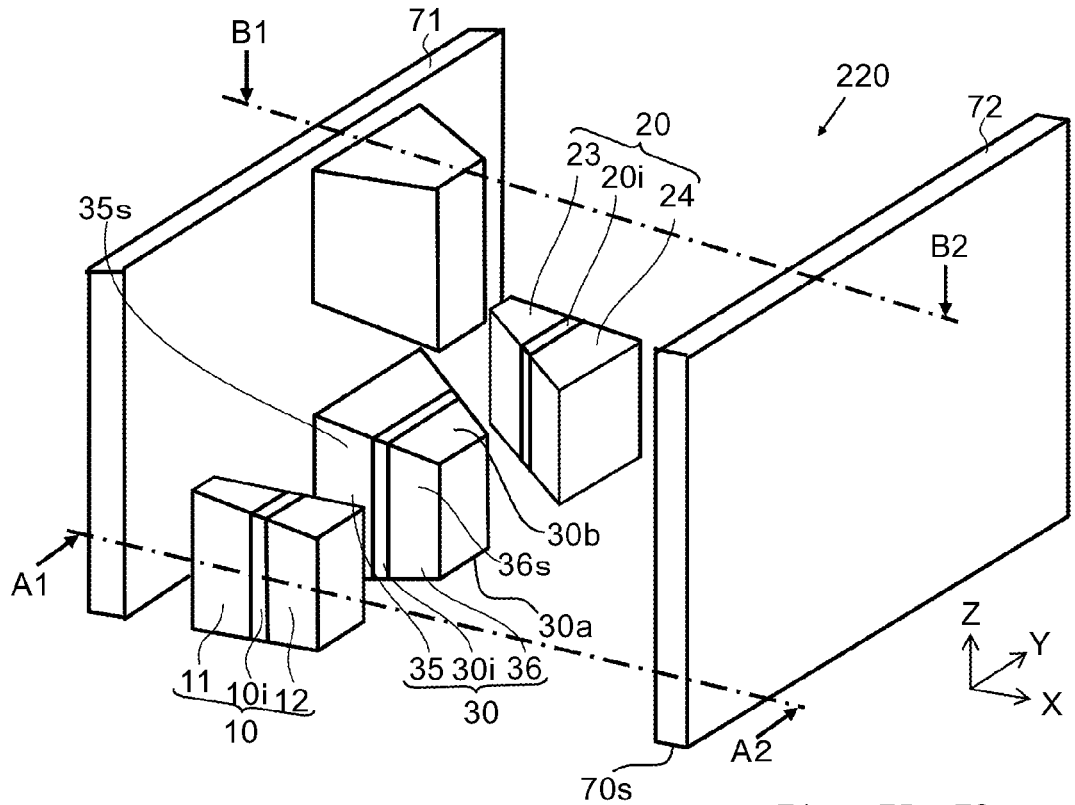
FIG. 8A to FIG. 8C are schematic views illustrating a magnetoresistance effect element according to a second embodiment.
Figures 8B, 8C:
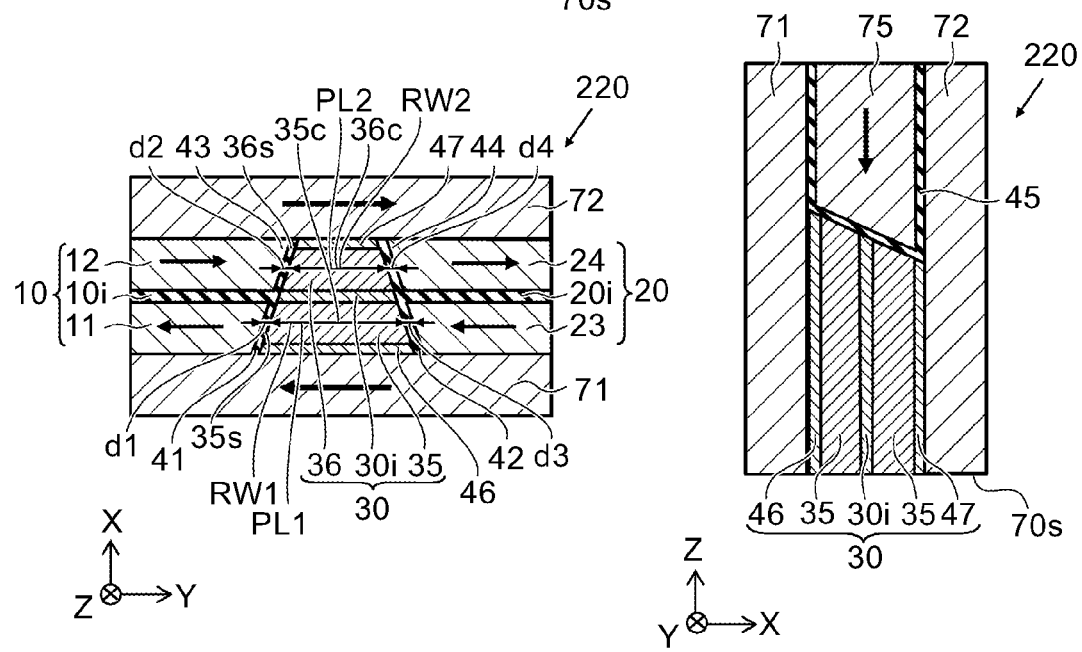

FIG. 8A to FIG. 8C are schematic views illustrating a magnetoresistance effect element according to a second embodiment.

FIG. 8A is a schematic perspective view. For easier viewing of the drawing in FIG. 8A, the insulating portions are not shown; and some of the components are shown as being separated from each other. FIG. 8B is a cross-sectional view along line A1-A2 of FIG. 8A. FIG. 8C is a cross-sectional view along line B1-B2 of FIG. 8A.

As shown in FIG. 8A to FIG. 8C, the first shield 71, the second shield 72, the first side magnetic unit 10, the second side magnetic unit 20, the stacked body 30, and the hard bias unit 75 are provided in the magnetoresistance effect element 220 according to the embodiment.

In the magnetoresistance effect element 220, the saturation magnetic flux density of the fifth magnetic layer 35 is less than the saturation magnetic flux density of the sixth magnetic layer 36. In the example, the first distance d1 is the same as the second distance d2; and the third distance d3 is the same as the fourth distance. Otherwise, the configuration of the magnetoresistance effect element 220 is similar to that of the magnetoresistance effect element 210.

In the magnetoresistance effect element 220 as well, the stacked body 30 has a side surface having a tapered configuration. In other words, the side surface 35s of the fifth magnetic layer 35 is tilted with respect to the stacking direction (the first direction); and the side surface 36s of the sixth magnetic layer 36 also is tilted. The side surface 36s of the sixth magnetic layer 36 is in a plane including the side surface 35s of the fifth magnetic layer 35.

The second surface area S2 of the sixth magnetic layer 36 is less than the first surface area S1 of the fifth magnetic layer 35. In such a case, the saturation magnetic flux density of the fifth magnetic layer 35 is set to be less than the saturation magnetic flux density of the sixth magnetic layer 36. For example, a material that has a saturation magnetic flux density that is less than the saturation magnetic flux density of the material of the sixth magnetic layer 36 is used as the fifth magnetic layer 35.

Thereby, the strength of the magnetization switching noise suppression magnetic field can be controlled appropriately. Thereby, a low-noise magnetoresistance effect element can be provided.

For example, the value (the first value) of the bias strength applied to the fifth magnetic layer 35 by the first magnetic layer 11 divided by the volume of the fifth magnetic layer 35 can be substantially equal to the value (the second value) of the bias strength applied to the sixth magnetic layer 36 by the second magnetic layer 12 divided by the volume of the sixth magnetic layer 36. For example, the first value can be set to be not less than 0.8 times the second value and not more than 1.2 times the second value.

In other words, the average strengths of the magnetization switching noise suppression magnetic fields applied to the fifth magnetic layer 35 and the sixth magnetic layer 36 can be substantially the same. Thereby, the magnetization switching phenomenon can be suppressed.

For example, the first material that includes at least one selected from CoFe, CoFeB, CoFeNi, CoFeSi, CoFeGe, CoFeSiGe, $Co_2MnSi$, $Co_2MnGe$, NiFe, CoFeMnSi, CoFeMnGe, and $FeO_x$ (Fe oxide) is used as the fifth magnetic layer 35. The second material that includes at least one selected from CoFe, CoFeB, CoFeNi, CoFeSi, CoFeGe, CoFeSiGe, $Co_2MnSi$, $Co_2MnGe$, NiFe, CoFeMnSi, CoFeMnGe, and $FeO_x$ (Fe oxide) is used as the sixth magnetic layer 36. The second material is different from the first material. For example, the second material includes an element that is different from the elements included in the first material. For example, the first material includes an element that is different from the elements included in the second material. The state in which the composition of the second material is different from the composition of the first material also is included in the state in which the second material is different from the first material. Different saturation magnetic flux densities are obtained by, for example, adjusting the composition ratio of these materials.

In the embodiment as well, for example, the second surface area S2 is not less than 0.7 times the first surface area S1 and not more than 0.9 times the first surface area S1. The first width RW1 of the fifth magnetic layer 35 is not less than 15 nm and not more than 40 nm; and the second width RW2 of the sixth magnetic layer 36 is not less than 10 nm and not more than 30 nm.

In such a case, for example, the saturation magnetic flux density of the fifth magnetic layer 35 is set to be not less than 0.8 times the saturation magnetic flux density of the sixth magnetic layer 36 and not more than 1.2 times the saturation magnetic flux density of the sixth magnetic layer 36.

For example, the first surface area S1, the second surface area S2, a saturation magnetic flux density Bs1 of the fifth magnetic layer 35, and a saturation magnetic flux density Bs2 of the sixth magnetic layer 36 may be set such that the value of S1×Bs1 is substantially equal to the value of S2×Bs2. For example, the value of S1×Bs1 may be set to be not less than 0.8 times the value of S2×Bs2 and not more than 1.2 times the value of S2×Bs2. For example, the saturation magnetic flux density Bs1 of the fifth magnetic layer 35 may be set to be not less than 0.7 teslas (T) and not more than 1.4 T. On the other hand, the saturation magnetic flux density of the sixth magnetic layer 36 may be set to be not less than 0.9 T and not more than 1.5 T.

In such a case as well, it is favorable for at least one selected from the first magnetic layer 11, the second magnetic layer 12, the third magnetic layer 23, and the fourth magnetic layer 24 to include at least one selected from the group consisting of NiFe, CoZrTa, CoZrNb, CoZrNbTa, CoZrTaCr, and CoZrFeCr. Thereby, high reproduction resolution is obtained.

In the magnetoresistance effect element 220 as well, the exchange coupling between the second shield 72 and the second magnetic layer 12 and the exchange coupling between the second shield 72 and the fourth magnetic layer 24 are stronger than the exchange coupling between the second shield 72 and the sixth magnetic layer 36.

In the example, the exchange coupling between the first shield 71 and the first magnetic layer 11 and the exchange coupling between the first shield 71 and the third magnetic layer 23 are stronger than the exchange coupling between the first shield 71 and the fifth magnetic layer 35.

In the embodiment as well, similarly to the magnetoresistance effect element 211, the first nonmagnetic layer 41 may extend between the first shield 71 and the first magnetic layer 11; and the second nonmagnetic layer 42 may extend between the second shield 72 and the third magnetic layer 23. The first magnetic layer 11 may not have exchange coupling with the first shield 71; and the third magnetic layer 23 may not have exchange coupling with the first shield 71.

The magnetoresistance effect element 220 according to the embodiment also can be manufactured by modifying a manufacturing method that is similar to that recited above if necessary. In the magnetoresistance effect element 220 according to the embodiment, the first distance d1 may be set to be shorter than the second distance d2; and the third distance d3 may be set to be shorter than the fourth distance d4.

In the magnetoresistance effect element 220 according to the embodiment, the saturation magnetic flux density of the first magnetic layer 11 and the saturation magnetic flux density of the second magnetic layer 12 may be different from each other. Also, the saturation magnetic flux density of the third magnetic layer 23 and the saturation magnetic flux density of the fourth magnetic layer 24 may be different from each other. In other words, in the case where the stacked body 30 has a side surface having a tapered configuration, the saturation magnetic flux density of the first magnetic layer 11 may be set to be less than the saturation magnetic flux density of the second magnetic layer 12. In such a case, the saturation magnetic flux density of the third magnetic layer 23 may be set to be less than the saturation magnetic flux density of the fourth magnetic layer 24. For example, a material that has a saturation magnetic flux density that is less than the saturation magnetic flux density of the material of the second magnetic layer 12 is used as the first magnetic layer 11. For example, a material that has a saturation magnetic flux density that is less than the saturation magnetic flux density of the material of the fourth magnetic layer 24 is used as the third magnetic layer 23.

Thereby, the strength of the magnetization switching noise suppression magnetic field can be controlled appropriately. Thereby, a low-noise magnetoresistance effect element can be provided.

The saturation magnetic flux density of the fifth magnetic layer 35 may be set to be less than the saturation magnetic flux density of the sixth magnetic layer 36 simultaneously with changing the saturation magnetic flux density of the magnetic layer included in the side magnetic unit.

For example, by the saturation magnetic flux density of the first magnetic layer 11 being less than the saturation magnetic flux density of the second magnetic layer 12, the value (the first value) of the bias strength applied to the fifth magnetic layer 35 by the first magnetic layer 11 divided by the volume of the fifth magnetic layer 35 can be substantially equal to the value (the second value) of the bias strength applied to the sixth magnetic layer 36 by the second magnetic layer 12 divided by the volume of the sixth magnetic layer 36. For example, the first value may be set to be not less than 0.8 times the second value and not more than 1.2 times the second value. Thereby, the magnetization switching phenomenon can be suppressed.

For example, the first magnetic layer 11 and the third magnetic layer 23 include a third material. The second magnetic layer 12 and the fourth magnetic layer 24 include a fourth material. The fourth material is different from the third material. For example, the fourth material may include an element that is different from the elements included in the third material. For example, the third material may include an element that is different from the elements included in the fourth material. The state in which the composition of the fourth material is different from the composition of the third material also is included in the state in which the fourth material is different from the third material.

Third Embodiment

The embodiment relates to a method for manufacturing the magnetoresistance effect element according to the first embodiment.

Figure 9:
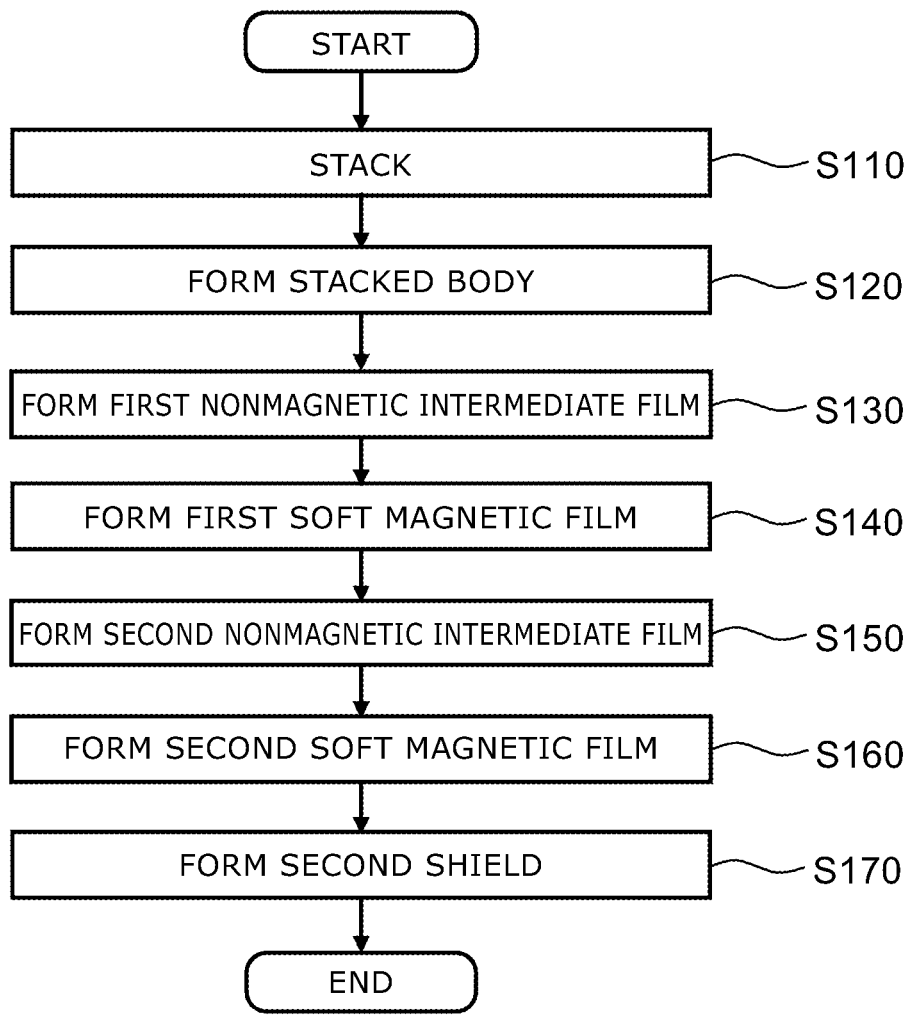
FIG. 9 is a flowchart illustrating the method for manufacturing the magnetoresistance effect element according to the third embodiment.

FIG. 9 is a flowchart illustrating the method for manufacturing the magnetoresistance effect element according to the third embodiment.

As shown in FIG. 9, the manufacturing method according to the embodiment includes a stacking process (step S110). In this process, the first ferromagnetic film (e.g., the fifth magnetic film 35f) is formed on the first shield 71; the first nonmagnetic intermediate film (e.g., the third intermediate film 30if) is formed on the first ferromagnetic film; and the second ferromagnetic film (e.g., the sixth magnetic film 36f) is formed on the first nonmagnetic intermediate film. In other words, for example, the processing described in regard to FIG. 5B is performed.

The manufacturing method further includes a process of forming a stacked body (step S120). In this process, the stacked body 30 that includes the first ferromagnetic layer (the fifth magnetic layer 35), the first nonmagnetic intermediate layer (the third intermediate layer 30i), and the second ferromagnetic layer (the sixth magnetic layer 36) is formed by patterning the first ferromagnetic film recited above, the first nonmagnetic intermediate film recited above, and the second ferromagnetic film recited above. The first ferromagnetic layer is formed from the first ferromagnetic film and has the first surface area S1. The first nonmagnetic intermediate layer is formed from the first nonmagnetic intermediate film. The second ferromagnetic layer is formed from the second ferromagnetic film and has the second surface area S2 that is less than the first surface area S1. In other words, for example, the processing described in regard to FIG. 5C is performed.

The manufacturing method includes a process of forming the first nonmagnetic film 41f on the side wall of the stacked body 30 (step S130). The first nonmagnetic film 41f has the first portion (the first nonmagnetic layer 41 and the second nonmagnetic layer 42) contacting the first ferromagnetic layer (the fifth magnetic layer 35) and the second portion (the third nonmagnetic layer 43 and the fourth nonmagnetic layer 44) contacting the second ferromagnetic layer (the sixth magnetic layer 36). In other words, for example, the processing described in regard to FIG. 5D and FIG. 5E is performed.

The manufacturing method further includes a process of forming a first soft magnetic film (step S140). In this process, the first soft magnetic film (the first magnetic film 11f) is formed on the first shield 71 to contact the first portion recited above and oppose the first ferromagnetic layer (the fifth magnetic layer 35) with the first portion recited above interposed. For example, the first soft magnetic film contacts the second portion recited above on the first shield 71 and opposes the first ferromagnetic layer (the fifth magnetic layer 35) with the second portion recited above interposed. In other words, for example, the processing described in regard to FIG. 5F is performed.

The manufacturing method further includes a process of forming the second nonmagnetic intermediate film (step S150). In this process, the second nonmagnetic intermediate film (the first intermediate film 10if) is formed on the first soft magnetic film to cover the second portion (the third nonmagnetic layer 43 and the fourth nonmagnetic layer 44). In other words, for example, the processing described in regard to FIG. 5G is performed.

The manufacturing method further includes a process of forming the second soft magnetic film (step S160). In this process, the second soft magnetic film (the second magnetic film 12f) is formed on the first intermediate film 10if). In other words, for example, the processing described in regard to FIG. 5H is performed.

The manufacturing method further includes a process of forming the second shield 72 (step S170). In this process, the second shield 72 is formed on the stacked body 30 and on the second soft magnetic film. In other words, for example, the processing described in regard to FIG. 5J is performed.

According to the manufacturing method according to the embodiment, a method for manufacturing a low-noise magnetoresistance effect element can be provided.

Fourth Embodiment

The embodiment relates to a magnetic head assembly and a magnetic recording and reproducing device that use the magnetoresistance effect element according to the first and second embodiments.

Figure 10:
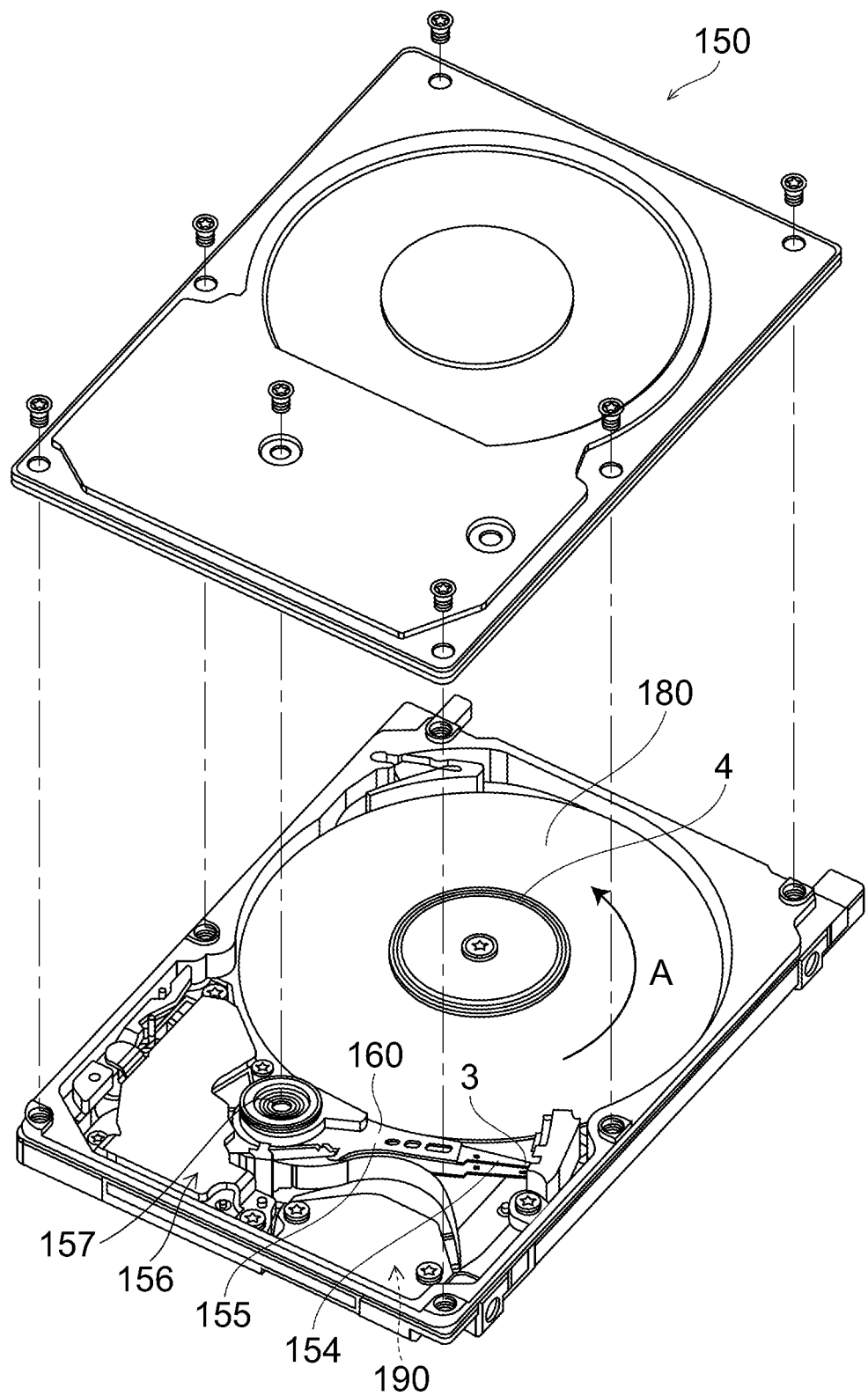
FIG. 10 is a schematic perspective view illustrating the magnetic recording and reproducing device according to the fourth embodiment.

FIG. 10 is a schematic perspective view illustrating the magnetic recording and reproducing device according to the fourth embodiment.

Figure 11A:
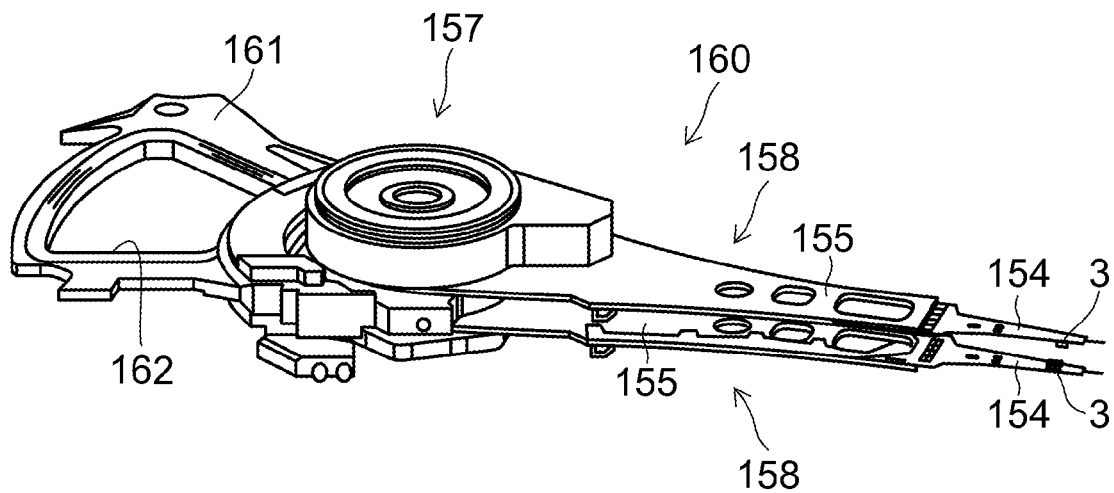
FIG. 11A and FIG. 11B are schematic perspective views illustrating portions of the magnetic recording device according to the fourth embodiment.
Figure 11B:
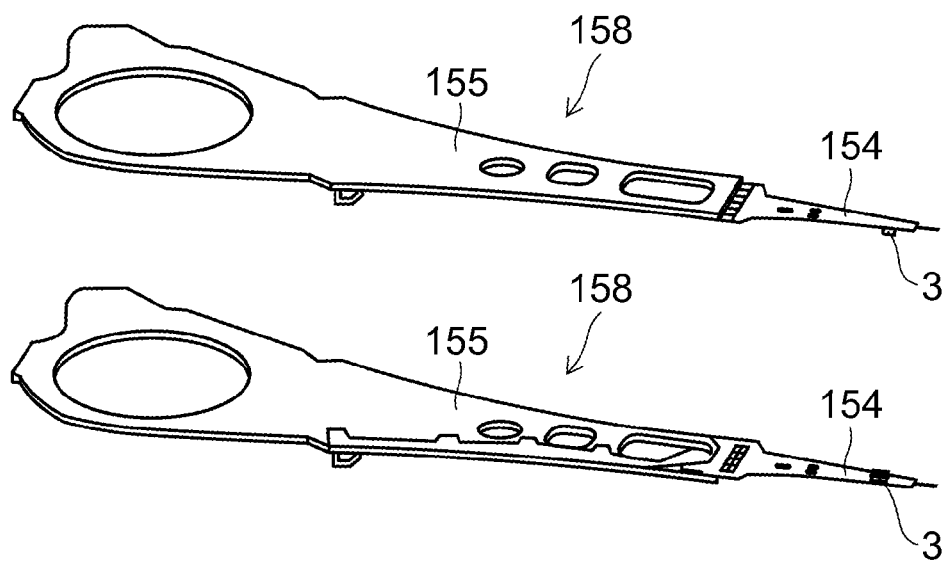

FIG. 11A and FIG. 11B are schematic perspective views illustrating portions of the magnetic recording and reproducing device according to the fourth embodiment.

As shown in FIG. 10, the magnetic recording and reproducing device 150 according to the embodiment is a device that uses a rotary actuator. A recording medium disk 180 is mounted to a spindle motor 4. The recording medium disk 180 is rotated in the direction of arrow A by a not-shown motor. The motor responds to, for example, a control signal from a not-shown drive apparatus controller. The magnetic recording and reproducing device 150 according to the embodiment may include multiple recording medium disks 180.

The recording/reproducing of the information stored in the recording medium disk 180 is performed by the head slider 3. The head slider 3 has the configuration described above. The head slider 3 is mounted to the tip of a suspension 154. The suspension 154 has a thin-film configuration. For example, the magnetic head (e.g., the magnetic head 110) according to the embodiment described above or a modification of the magnetic head is mounted at the vicinity of the tip of the head slider 3. The magnetic head may include the magnetoresistance effect elements according to the first and second embodiments or a magnetoresistance effect element of a modification of these elements.

When the recording medium disk 180 rotates, the head slider 3 is held above the surface of the recording medium disk 180. In other words, the downward pressure due to the suspension 154 is balanced by the pressure generated by the medium-opposing surface of the head slider 3. Thereby, the distance between the medium-opposing surface of the head slider 3 and the surface of the recording medium disk 180 is maintained at a prescribed value. In the embodiment, a so-called contact-sliding head slider 3 that contacts the recording medium disk 180 may be used.

The suspension 154 is connected to one end of an actuator arm 155. The actuator arm 155 includes, for example, a bobbin unit that holds a not-shown drive coil, etc. A voice coil motor 156 is provided at the other end of the actuator arm 155. The voice coil motor 156 is, for example, one type of linear motor. The voice coil motor 156 may include, for example, a not-shown drive coil and a not-shown magnetic circuit. For example, the drive coil is wound onto the bobbin unit of the actuator arm 155. The magnetic circuit may include, for example, a not-shown permanent magnet and a not-shown opposing yoke. The permanent magnet and the opposing yoke oppose each other; and the drive coil is disposed between the permanent magnet and the opposing yoke.

The actuator arm 155 is held by, for example, not-shown ball bearings. The ball bearings are provided, for example, at two locations on and under a bearing unit 157. The voice coil motor 156 can cause the actuator arm 155 to rotate and slide unrestrictedly. As a result, the magnetic head can be moved to any position of the recording medium disk 180.

FIG. 11A illustrates the configuration of a portion of the magnetic recording and reproducing device and is an enlarged perspective view of a head stack assembly 160.

FIG. 11B is a perspective view illustrating a magnetic head assembly (a head gimbal assembly (HGA)) 158 which is a portion of the head stack assembly 160.

As shown in FIG. 11A, the head stack assembly 160 includes the bearing unit 157, the head gimbal assembly 158, and a support frame 161. The head gimbal assembly 158 extends from the bearing unit 157. The support frame 161 extends from the bearing unit 157 in the direction opposite to the HGA. The support frame 161 supports a coil 162 of the voice coil motor.

As shown in FIG. 11B, the head gimbal assembly 158 includes the actuator arm 155 and the suspension 154. The actuator arm 155 extends from the bearing unit 157. The suspension 154 extends from the actuator arm 155.

The head slider 3 is mounted to the tip of the suspension 154. The magnetic head according to the embodiment or a modification of the magnetic head is mounted to the head slider 3.

In other words, the magnetic head assembly (the head gimbal assembly) 158 according to the embodiment includes the magnetic head according to the embodiment, the head slider 3 to which the magnetic head is mounted, the suspension 154 that has the head slider 3 mounted to one end of the suspension 154, and the actuator arm 155 that is connected to the other end of the suspension 154.

The suspension 154 includes lead wires (not shown) for writing and reproducing signals, for a heater to adjust the fly height, etc. The lead wires are electrically connected to the electrodes of the magnetic head included in the head slider 3.

A signal processor 190 is provided to write and reproduce the signals to and from the magnetic recording medium by using the magnetic head.

The signal processor 190 is provided, for example, on the back surface side of the drawing of the magnetic recording and reproducing device 150 illustrated in FIG. 10. Input/output lines of the signal processor 190 are electrically connected to the magnetic head by being connected to electrode pads of the head gimbal assembly 158.

In other words, the signal processor 190 is electrically connected to the magnetic head.

The change of the resistance of the stacked body 30 of the magnetic head corresponding to the medium magnetic field recorded in the magnetic recording medium 80 is sensed by, for example, the signal processor 190.

Thus, the magnetic recording and reproducing device 150 according to the embodiment includes a magnetic recording medium, the magnetic head according to the embodiment recited above, a movable portion that is relatively movable in a state in which the magnetic recording medium and the magnetic head are separated from each other or in a state in which the magnetic recording medium and the magnetic head contact each other, a position control unit that aligns the magnetic head at a prescribed recording position of the magnetic recording medium, and a signal processor that writes and reproduces signals to and from the magnetic recording medium by using the magnetic head.

In other words, the recording medium disk 180 is used as the magnetic recording medium 80 recited above. The movable portion recited above may include the head slider 3. The position control unit recited above may include the head gimbal assembly 158.

Thus, the magnetic recording and reproducing device 150 according to the embodiment includes the magnetic recording medium, the magnetic head assembly according to the embodiment, and the signal processor 190 that writes and reproduces signals to and from the magnetic recording medium by using the magnetic head mounted to the magnetic head assembly.

According to the magnetic recording and reproducing device 150 according to the embodiment, low-noise reproduction is possible by using the magnetic head according to the embodiment recited above.

According to the embodiments, a magnetoresistance effect element, a magnetic head, a magnetic head assembly, a magnetic recording and reproducing device, and a method for manufacturing the magnetoresistance effect element having low noise can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the magnetoresistance effect element, the magnetic head, the magnetic head assembly, and the magnetic recording and reproducing device such as the first shield, the second shield, the first to sixth magnetic layers, the first to third intermediate layers, the first to seventh nonmagnetic layers, etc., from known art; and such practice is within the scope of the invention to the extent that similar effects are obtained.

Further, any two or more components of the specific examples may be combined within the extent of technical feasibility and are included in the scope of the invention to the extent that the purport of the invention is included.

Moreover, all magnetoresistance effect elements, magnetic heads, magnetic head assemblies, magnetic recording and reproducing devices, and methods for manufacturing the magnetoresistance effect elements practicable by an appropriate design modification by one skilled in the art based on the magnetoresistance effect elements, the magnetic heads, magnetic head assemblies, the magnetic recording and the reproducing devices, and the methods for manufacturing magnetoresistance effect elements described above as embodiments of the invention also are within the scope of the invention to the extent that the spirit of the invention is included.

Further, any two or more components of the specific examples may be combined within the extent of technical feasibility and are included in the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A magnetoresistance effect element, comprising:
a first shield;
a second shield;
a first side magnetic unit including
  a first magnetic layer provided between the first shield and the second shield, the first magnetic layer being soft magnetic,
  a first intermediate layer provided between the first magnetic layer and the second shield, the first intermediate layer being nonmagnetic, and
  a second magnetic layer provided between the first intermediate layer and the second shield, the second magnetic layer being soft magnetic;
a second side magnetic unit including
  a third magnetic layer provided between the first shield and the second shield to be separated from the first side magnetic unit in a second direction intersecting a first direction from the first shield toward the second shield, the third magnetic layer being soft magnetic,
  a second intermediate layer provided between the third magnetic layer and the second shield to be separated from the first side magnetic unit in the second direction, the second intermediate layer being nonmagnetic, and
  a fourth magnetic layer provided between the second intermediate layer and the second shield to be separated from the first side magnetic unit in the second direction, the fourth magnetic layer being soft magnetic
a stacked body including
  a fifth magnetic layer provided between the first shield and the second shield and between the first side magnetic unit and the second side magnetic unit, the fifth magnetic layer being ferromagnetic and having a first surface area,
  a third intermediate layer provided between the fifth magnetic layer and the second shield, the third intermediate layer being nonmagnetic, and
  a sixth magnetic layer provided between the third intermediate layer and the second shield, the sixth magnetic layer being ferromagnetic and having a second surface area less than the first surface area; and
a hard bias unit provided between the first shield and the second shield to be arranged with the stacked body in a third direction intersecting the first direction and intersecting the second direction,
a first distance between the first magnetic layer and the fifth magnetic layer in a first plane perpendicular to the first direction and passing through a center of the fifth magnetic layer in the first direction being shorter than a second distance between the second magnetic layer and the sixth magnetic layer in a second plane perpendicular to the first direction and passing through a center of the sixth magnetic layer in the first direction,
a third distance between the third magnetic layer and the fifth magnetic layer in the first plane being shorter than a fourth distance between the fourth magnetic layer and the sixth magnetic layer in the second plane.

2. The element according to claim 1, wherein the second distance is not less than 1.2 times the first distance and not more than 2.4 times the first distance.

3. The element according to claim 1, wherein
the first distance is not less than 1 nanometer and not more than 4 nanometers, and
the second distance is not less than 2 nanometers and not more than 5 nanometers.

4. The element according to claim 1, wherein S1×d1 is not less than 0.8 times S2×d2 and not more than 1.2 times S2×d2, where S1 is the first surface area, S2 is the second surface area, d1 is the first distance, and d2 is the second distance.

5. The element according to claim 1, wherein the second surface area is not less than 0.7 times the first surface area and not more than 0.9 times the first surface area.

6. The element according to claim 1, wherein
a length of the fifth magnetic layer along the second direction in the first plane is not less than 15 nanometers and not more than 40 nanometers, and
a length of the sixth magnetic layer along the second direction in the second plane is not less than 10 nanometers and not more than 30 nanometers.

7. The element according to claim 1, wherein
a side surface of the fifth magnetic layer is tilted with respect to the first direction, and
a side surface of the sixth magnetic layer is in a plane including the side surface of the fifth magnetic layer.

8. The element according to claim 1, wherein at least one selected from the first magnetic layer, the second magnetic layer, the third magnetic layer, and the fourth magnetic layer includes at least one selected from the group consisting of NiFe, CoZrTa, CoZrNb, CoZrNbTa, CoZrTaCr, and CoZrFeCr.

9. The element according to claim 1, wherein an exchange coupling between the second shield and the second magnetic layer and an exchange coupling between the second shield and the fourth magnetic layer are stronger than an exchange coupling between the second shield and the sixth magnetic layer.

10. The element according to claim 9, wherein an exchange coupling between the first shield and the first magnetic layer and an exchange coupling between the first shield and the third magnetic layer are stronger than an exchange coupling between the first shield and the fifth magnetic layer.

11. The element according to claim 1, wherein a value of a bias strength applied to the fifth magnetic layer by the first magnetic layer divided by a volume of the fifth magnetic layer is not less than 0.8 times and not more than 1.2 times a value of a bias strength applied to the sixth magnetic layer by the second magnetic layer divided by a volume of the sixth magnetic layer.

12. A magnetic head comprising the magnetoresistance effect element according to claim 1.

13. A magnetic head assembly, comprising:
the magnetic head according to claim 12;
a suspension configured to have the magnetic head mounted to one end of the suspension; and
an actuator arm connected to one other end of the suspension.

14. A magnetic recording and reproducing device, comprising:
the magnetic head assembly according to claim 13; and
a magnetic recording medium including information configured to be reproduced using the magnetic head mounted to the magnetic head assembly.

* * * * *